United States Patent
Wesström et al.

(10) Patent No.: US 11,081,863 B2
(45) Date of Patent: Aug. 3, 2021

(54) OPTICAL DEVICE AND METHOD FOR CONTROLLING SUCH A DEVICE

(71) Applicant: Finisar Sweden AB, Järfälla (SE)

(72) Inventors: Jan-Olof Wesström, Stockholm (SE); Per Granestrand, Tyresö (SE); Martin Anders Isak Stattin, Järfälla (SE); Staffan David Hellström, Vendelsö (SE)

(73) Assignee: FINISAR SWEDEN AB, Järfälla (SE)

( * ) Notice: Subject to any disclaimer, the term of this patent is extended or adjusted under 35 U.S.C. 154(b) by 480 days.

(21) Appl. No.: 15/953,392

(22) Filed: Apr. 13, 2018

(65) Prior Publication Data

US 2018/0309267 A1    Oct. 25, 2018

Related U.S. Application Data

(60) Provisional application No. 62/487,298, filed on Apr. 19, 2017.

(51) Int. Cl.
| | |
|---|---|
| *H01S 5/50* | (2006.01) |
| *H01S 5/042* | (2006.01) |
| *H01S 5/026* | (2006.01) |
| *H01S 5/22* | (2006.01) |

(Continued)

(52) U.S. Cl.
CPC .......... *H01S 5/5027* (2013.01); *H01S 5/0265* (2013.01); *H01S 5/042* (2013.01); *H01S 5/06213* (2013.01); *H01S 5/1039* (2013.01); *H01S 5/22* (2013.01); *H01S 2301/02* (2013.01)

(58) Field of Classification Search
CPC ....... H01S 5/0265; H01S 5/042; H01S 5/5027
See application file for complete search history.

(56) References Cited

U.S. PATENT DOCUMENTS

| | | | | |
|---|---|---|---|---|
| 4,947,134 A | * | 8/1990 | Olsson | H04B 10/2914 |
| | | | | 359/344 |
| 5,521,754 A | * | 5/1996 | Nitta | H04B 10/2914 |
| | | | | 359/344 |

(Continued)

OTHER PUBLICATIONS

Griffin et al. "InP Coherent Optical Modulator with Integrated Amplification for High Capacity Transmission" 2015 Optical Fiber Communications Conference and Exhibition (OFC) (Year: 2015).*

*Primary Examiner* — Eric L Bolda
(74) *Attorney, Agent, or Firm* — Blank Rome LLP

(57) ABSTRACT

An optical device comprises a light input, a light modulating means and a light output. The optical device further comprises an optical amplification device arranged to amplify light travelling between said light modulating means and said output. The optical amplification device comprises first and second serially connected post SOA (Semiconductor Optical Amplifier) units, each comprising at least one respective serially connected post SOA segment, which device is arranged to vary a light amplification by varying respective SOA bias voltages across said post SOA segments. A total SOA length of the first post SOA unit is relatively longer than a total SOA length of the second post SOA unit, which is relatively shorter. The optical device is arranged to, during operation using a particular operation program, always keep respective SOA bias voltages across each of the post SOA segments of the first post SOA unit at +0.5 V or more.

26 Claims, 17 Drawing Sheets

(51) Int. Cl.
*H01S 5/10* (2021.01)
*H01S 5/062* (2006.01)

(56) References Cited

U.S. PATENT DOCUMENTS

| | | | | |
|---|---|---|---|---|
| 2005/0012988 A1* | 1/2005 | Kim | ............... | H01S 5/50 |
| | | | | 359/344 |
| 2013/0308178 A1* | 11/2013 | Matsui | ............... | B82Y 20/00 |
| | | | | 359/344 |
| 2014/0362433 A1* | 12/2014 | Adams | ............... | H01S 5/50 |
| | | | | 359/344 |
| 2016/0233642 A1* | 8/2016 | Takabayashi | ......... | H01S 5/4087 |

* cited by examiner

OPTICAL DEVICE AND METHOD FOR CONTROLLING SUCH A DEVICE

The present invention relates to an optical device, in particular to such an optical device arranged to modulate the light output from a laser into a data signal, in particular such a device which is a semiconductor device. The invention also relates to a method for controlling a device of the said type.

In many laser modulation applications, it is necessary to use amplification to achieve a sufficiently high-power output light. In particular for wavelength multiplexed channels, it is often desirable to adjust the output light power of individual transmitters to balance the power of such channels.

To increase the output power of modulator chips such as IQM modulator chips, Semiconductor Optical Amplifiers (SOAs) have been integrated monolithically in the modulator chip. Such a setup is described in R. A. Griffin et al., "InP Coherent Optical Modulator with Integrated Amplification for High Capacity Transmission," OFC 2015, paper Th4E.2. This way, higher output light power can be achieved for the same input electric power, or lower electric power into the modulator chip can be used for a fixed output light power.

For power dissipation efficiency, it is in general beneficial to amplify late, for example in the modulator chip instead of in the laser, or even better towards the end of the modulator chip after losses in the modulator. A way to understand this is that this way the power level in the system becomes lower so less power is lost in it in absolute terms. Another way to explain this is in terms of the saturation of amplifiers. For a fixed pump current in an SOA, the gain falls with increasing input light power, so to obtain the same amplification a higher gain current is required. An SOA arranged after the modulating components is herein denoted a "post SOA".

However, while providing high efficiency, such a post SOA will receive relatively low input light power from the modulating components. As a result, there will be higher level of Amplified Spontaneous Emission (ASE) noise at the output of the post SOA. This, in turn, reduces the OSNR (Optical Signal to Noise Ratio), which is undesirable. Therefore, it is also beneficial to amplify before modulation components, using a SOA arranged before said modulation components, herein denoted a "pre SOA".

FIG. 1 shows a known dual IQ modulator chip 10, in which the light is first amplified, after splitting, using a pair of pre SOAs 21, 22. After the light has passed through the modulating components 25, the light is then again amplified using a pair of post SOAs 23, 24.

FIGS. 2a-2d show a known pre or post SOA 40 useful in the setup illustrated in FIG. 1. FIGS. 2a and 2b are respective lateral cross-sections of the SOA 40 at A and B, respectively. FIG. 2c is a top view, and FIG. 2d is a longitudinal cross section at C. Such a SOA 40 is designed as a shallow ridge configuration, comprising a passive waveguiding material 41; a gain waveguiding material 42; a ridge 43; and an electric contact 44 for providing a desired voltage to the SOA 40. The SOA 40 can be butt coupled to modulator material waveguides, such as the non-gain material 41 being butt coupled to the gain material 42.

When measuring in-band OSNR, an optical spectrum analyser is typically used with resolution bandwidth setting 0.1 nm, to measure the level of ASE close to the wavelength of the signal. The ratio of the signal power and the amount of noise in 0.1 nm is the OSNR. The noise next to a signal is important, since it constitutes a disturbance at the receiving end which is difficult to filter out.

In a wavelength multiplexed system, one can use a passive MUX (MUltipleXer) to inject signals from different light transmitters, each on their own wavelength, on the same fibre. If M channels are muxed onto the same fibre this way, the signal power of each signal is decreased by a factor M. However, the noise in the fibre for a certain lambda (the wavelength where one transmitter is sending) will be the average of the noises from the individual transmitters. Therefore, the noise level from a transmitter is not only important around the signal wavelength itself, but also at all other wavelengths, since other transmitters may transmit at those other wavelengths. Therefore, another important metric to consider is the "worst point OSNR", which is the signal power from a transmitter divided by the highest observed ASE power in the considered wavelength spectrum used for the transmission system in question. Such spectrum may, for example, be the C-band. The worst point OSNR can be measured using an optical spectrum analyser, typically set at a resolution bandwidth of 0.1 nm. The light signal power divided by the highest point ASE gives the worst point OSNR.

An acceptable level of worst point OSNR can for instance be 45 dB for 16QAM modulation format at 32 GBd.

In general, it is desirable to be able to vary the output light power, such as across a dynamic power range which is 10 dB wide. Therefore, it is preferred to include a light power adjustment function in the modulator chip itself, to reduce cost and to avoid using external VOAs (Variable Optical Attenuators). Such external VOAs may, for instance, be mechanical and typically consume valuable physical space in the transmitter.

In known applications using post SOAs, it is possible to reduce the output power to a desired level by reducing the incoming light power to the post SOA. However, this will result in a reduction of the OSNR, which is not desirable. It is also possible to instead reduce the pumping of the post SOA, but this will result in an increase of the spontaneous emission factor ($N_{sp}$, also known as the population inversion factor), in turn reducing both the OSNR and the worst point OSNR.

The present invention solves the above described problems. In addition, it provides a transmitter which is small, cheap and which can control the output light power across a broad interval.

Hence, the invention relates to an optical device comprising a light input, a light modulating means and a light output, wherein the optical device further comprises an optical amplification device arranged to amplify light travelling between said light modulating means and said output, which optical amplification device comprises a first and a second serially connected post SOA (Semiconductor Optical Amplifier) unit, each comprising at least one respective serially connected post SOA, which device is arranged to vary a light amplification by varying respective SOA bias voltages across said post SOAs, wherein a total SOA length of the first post SOA unit is relatively longer than a total SOA length of the second post SOA unit, which is relatively shorter, and wherein the optical device is arranged to, during operation using a particular operation program, always keep respective SOA bias voltages across each of the post SOAs of the first post SOA unit at +0.5 V or more.

Moreover, the invention relates to a method for modulating light using an optical device comprising a light input; a light modulating means; a light output; and an optical amplification device arranged to amplify light travelling between said light modulating means and said output, in turn comprises a first and a second serially connected post SOA (Semiconductor Optical Amplifier) unit, each comprising at least one respective serially connected post SOA, wherein a total SOA length of the first post SOA unit is relatively longer than a total SOA length of the second post SOA unit, which is relatively shorter, which method comprises varying respective SOA bias voltages across the said post SOAs to achieve a desired amplification level of light passing the optical amplification device while keeping respective SOA bias voltages across the post SOAs of the first SOA unit at minimum+0.5 V.

In the following, the invention will be described in detail, with reference to exemplifying embodiments of the invention and to the enclosed drawings, wherein.

In general for a pumped post SOA, OSNR decreases with reduced pumping. This will be explained in the following.

For a fixed amplification and input light power, high inversion in the amplifier increases OSNR. This is related to the fact that the spontaneous emission per unit length in the SOA is proportional to f2(1−f1), wherein f1 and f2 are the quasi fermi functions for the conduction and valence band, respectively.

The gain in the SOA is proportional to f2(1−f1)−(1−f2)f1=f2−f1, so that the relation between spontaneous emission per unit length and the gain is proportional to $$\frac{f2}{1-f1} \cdot \frac{1}{f2-f1} = N_{sp}.$$

$N_{sp}$ is the spontaneous emission factor, also known as population inversion factor. $N_{sp}>1$ as long as there is positive gain.

An amplifier of gain G produces light noise on its output that can be described as a spectral density $$\rho_{ASE} = \frac{N_{sp}(G-1)hf}{2}$$

in to one polarization, where h is the Planck constant and f is the optical frequency.

The noise power into a particular bandwidth $B_r$ is then $$\rho_{ASE} = \frac{N_{sp}(G-1) \cdot hf \cdot B_r}{2}.$$

OSNR may be measured using a spectrum analyser with at a bandwidth of $D_\lambda=0.1$ nm, so that $$B_r = D_\lambda \frac{c}{\lambda^2},$$

where c is the speea of light and λ is the wavelength. At the C-band (around 1550 nm), λ=1550 nm, so that $B_r \approx 12.5$ GHz, and $$\frac{hf \cdot B_r}{2} \approx 0.8 \cdot 10^{-6} \text{ mW} \approx -61 \text{ dBm.}$$

Furthermore, assuming that the input signal has no significant noise, $$OSNR = \frac{P_{in}G}{\rho_{ASE}} = \frac{P_{in}G}{(G-1)N_{sp} \cdot \frac{hf}{2} B_r}.$$

From the above, it is clear that low $N_{sp}$ is beneficial for OSNR.

Figure 3A:
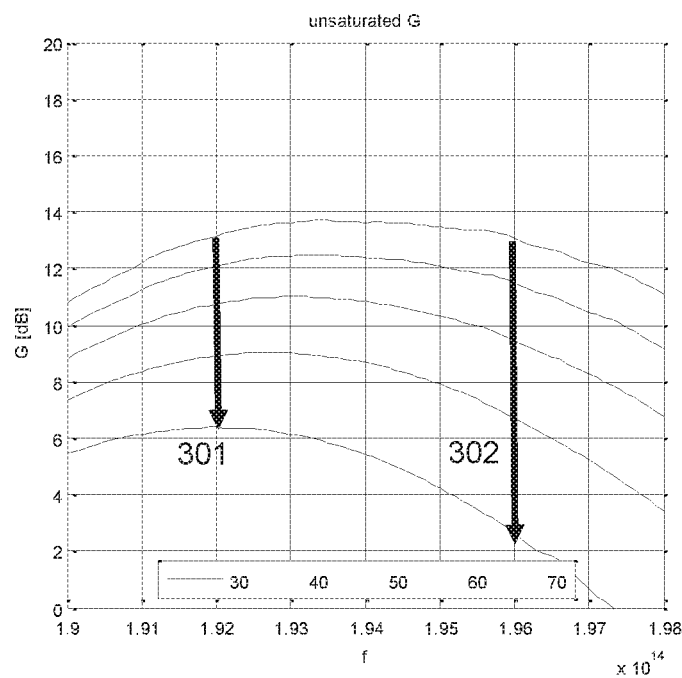
FIG. 3a is a chart showing how the gain G in an SOA varies as a function of frequency f for different bias currents in an SOA.
Figure 3B:
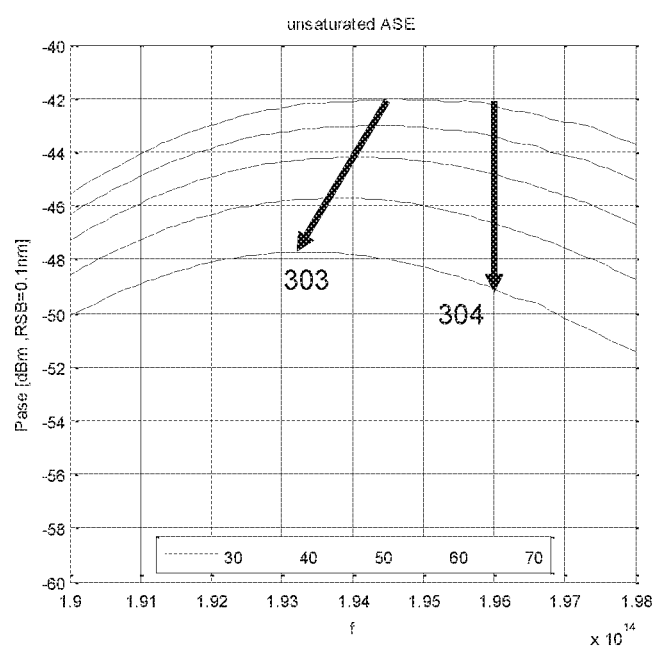
FIG. 3b is a chart showing how the ASE (in fact, $\rho_{ASE}$) in a SOA varies as a function of frequency f for different bias currents in an SOA.

FIGS. 3a and 3b illustrate how the gain varies as a function of bias current in an SOA. In FIG. 3a, for several bias currents, the resulting gain G is shown as a function of the input light frequency. In FIG. 3b, the respective $\rho_{ASE}$ is shown for the corresponding several bias currents. In both FIGS. 3a and 3b, increasing bias currents result in higher G and $\rho_{ASE}$. As is clear from FIGS. 3a and 3b, the ASE does not vary as quickly as the gain does with varying bias current. This means the OSNR (for a fixed incoming light power $P_{in}$) decreases with reduced SOA current. See arrows 301, 302, 303, 304, showing exemplifying decreases in gain and ASE, respectively, as the SOA current decreases. For instance, at arrow 302 the gain decreases about 12 dB at 196 THz, but the corresponding peak ASE (arrow 303) does not fall as fast. When considering the same fixed frequency (arrow 304), ASE decreases faster, but still not as fast as the gain.

Figure 4A:
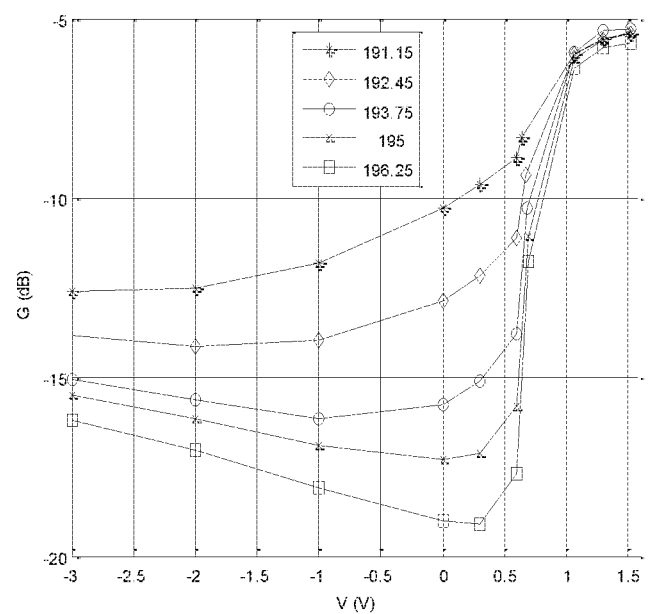
FIG. 4a is a chart showing how the gain G in a SOA varies as a function of an applied SOA voltage, for a set of different amplified light frequencies.
Figure 4B:
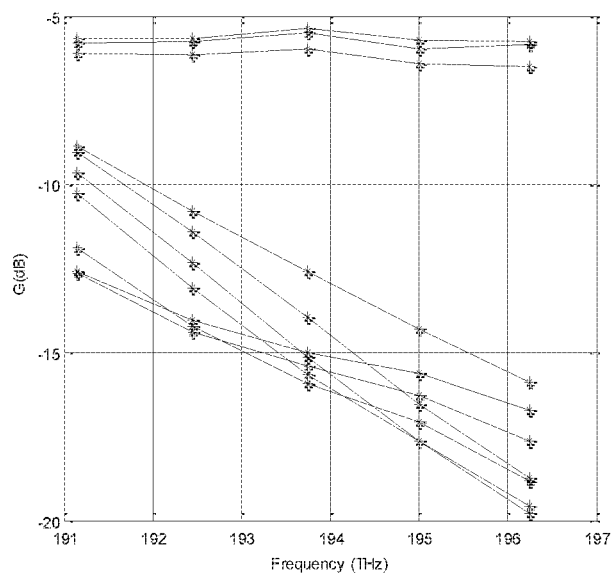
FIG. 4b is a chart showing how the gain G shown in FIG. 4a varies as a function of an amplified light frequency, for a set of different SOA voltages.

FIGS. 4a and 4b show, using the corresponding data, the measured amplification G of a 50 μm long single segment SOA, as a function of SOA voltage (FIG. 4a) and input light frequency (FIG. 4b). In FIG. 4a, the amplification G is shown for a number of different frequencies (see legend in chart). In FIG. 4b, the amplification G is shown for a number of different voltages. It is noted that G depends relatively little on the frequency at strong forward bias and at deep reverse bias. Herein, "strong forward bias" in general means that the bias voltage is at least +0.7 V, preferably +0.9 V (alternatively that the current density is at least 10 μA/μm), while "deep reverse bias" means that the bias voltage is at the most −2 V. At intermediate bias voltages, there is a relatively larger variability of G depending on the frequency. In FIGS. 4a and 4b, G is depicted on a relative scale since there were unknown losses in the measurement system used to produce the data.

Hence, in particular in the case for operating at high optical signal frequencies, the noise at relatively low frequencies may be attenuated much less than the signal itself. This can be understood in terms of thermal tails of electrons or holes partially populating the lower energies, and therefore reducing the attenuation for the low energies. This effect is combined with an increase of the bandgap when going from forward to reverse bias, due to reduced heating and bandgap renormalization. This increase of bandgap reduces the attenuation at the lowest frequencies. The largest slope dG/df may occur at intermediate biases. In a quantum well amplifier, at deeper biases the Quantum Confined Stark Effect (QCSE) may make the attenuation slope smaller. QCSE at deeper biases can increase attenuation at low frequencies and decrease the attenuation at high frequencies, in effect reducing the attenuation slope. Therefore, the best worst point OSNR occurs for strong forward biased conditions and for deeply reverse biased conditions of a particular observed SOA segment.

The present invention uses the discovery that a particular SOA can be split into several sub SOAs that can be controlled separately in terms of SOA current. As will be understood from the following, this results in an increased OSNR for corresponding total amplifications.

In one aspect of the present invention, one (preferably an upstream one) of the resulting post sub SOA segments may be strongly forward biased (have high pumping), so that the optical signal is amplified with low $N_{sp}$, in turn resulting in the post SOA segment in question adding relatively little noise. A second or subsequent (preferably downstream arranged) post sub SOA segment may then have high pumping when a high optical output power is required, but when lower output power is needed it can have lower pumping or even reverse bias.

Figure 5:
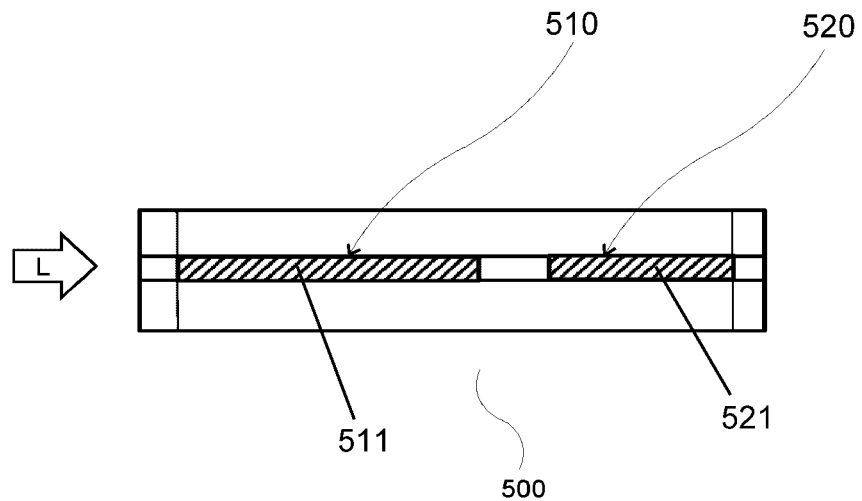
FIG. 5 is a simplified top view of an optical amplification device according to a first exemplifying embodiment of the present invention, comprising two post SOA segments.

This can be understood by considering a simple example, shown in FIG. 5, in which a post SOA 500 comprises two individually controllable post sub SOAs 510, 520, each being connected to a control means by respective electric contacts 511, 521. The first (upstream) segment 510 is always in (preferably strong) forward bias during operation, while the bias of the second (downstream) segment 520 is varied, so as to vary the output light power. L denotes the direction of light, in FIG. 5 and also in other Figures.

In this example, the lower pumping will increase $N_{sp}$ in the last post SOA segment 520. However, little noise will be added to the output light, since there are no amplifiers after the last (most downstream) post SOA segment 520, why the noise created will not be further amplified. This is the preferred configuration. Furthermore, the last SOA segment 520 can be made relatively short, so that there is less length for noise to accumulate as light passes through the last post SOA segment 520 in question. Moreover, in the extreme case of a very weak output light power, the last post SOA segment 520 may have no excited carriers, why no spontaneous emission will be produced.

In the general case, for a (preferably strong) forward biased SOA, the worst point OSNR will typically be lower than the (in-band) OSNR, since the ASE peak can be at some other frequency than the signal optical frequency. In particular when operating at high frequencies, this problem is accentuated when reducing the SOA current to reduce output light power. Then the gain peak and ASE peak move to lower optical frequencies, so that the noise at lower frequencies is not reduced as much as the signal power. This is, again, illustrated in FIGS. 3a and 3b.

When splitting a particular post SOA into individually controllable post sub SOA segments 510, 520, with their own contacts 511, 521 and controlled as mentioned above, the ASE peak of the first post SOA segment 510 will not move when the output light power is reduced, since the bias current of the first post SOA segment 510 is not changed. Instead, the output light power is reduced by reducing amplification in the second post SOA segment 520, which may even move into absorption by reducing the post SOA current delivered via contact 521. As a result, the carrier density in the second post SOA segment 520 will be reduced and the noise produced in the second post SOA segment 520 will decrease. But even neglecting the remaining spontaneous emission in the second SOA segment 520, the second SOA segment 520 can affect the noise spectrum at the output, and also the worst point OSNR. The reason is that the attenuation in the second post SOA segment 520 has a non-flat spectral profile, and in particular a slope vs frequency dG/df that varies as the bias goes from positive to negative bias voltages.

In general, the present invention proposes to avoid the use of intermediate bias voltage settings (with associated sloped transmission) of any post SOA segment, and in particular for any relatively long post SOA segments. As will be detailed in the following, this may be accomplished by making a first one of the post SOA segments (preferably a downstream post SOA segment) relatively short, so that when fully reverse biased (with small attenuation slope) the attenuation gives roughly half the required variation of output power. Another, second, post SOA segment (preferably an upstream post SOA segment) may then be arranged to be relatively long, and operated at forward bias at all times, preferably at a strong forward bias. Then, the relatively short post SOA segment may be varied to vary the output light power holding the relatively long post SOA at a constant forward bias, at which the attenuation is rather flat. Or the relatively short post SOA may be held at a constant strong forward bias while the relatively long post SOA is varied to vary the output light power. When the relatively long post SOA is varied, to reach intermediate light power requirements, the forward bias of the relatively long post SOA segment is preferably varied only to a limited degree, such only between +0.6 V and +2 V, or only between 1 μA/μm and 40 μA/μm. Since the bias in the said relatively long post SOA segment is not varied very much, the OSNR and worst point OSNR will also not vary very much.

Alternatively, the post SOA may be split into more than two post SOA segments. In such a configuration, a first (preferably upstream) post SOA segment, which is relatively long, may be (preferably strong) forward biased in all control states. The other, more downstream arranged, post SOA segments may then be relatively short and either forward or reverse biased so strongly/deeply that they have rather flat attenuation as a function of light frequency. This way, the total length of the post SOA segments has an essentially flat gain spectrum. The output light power is determined by how large a share of the total post SOA segment length is (preferably strong) forward biased, and how large a share of the total length is reverse biased. In addition, the bias current of individual post SOA segments may be fine adjusted to reach the required light power level.

Hence, the split post SOA illustrated in FIG. 5 is an example of a split SOA which is useful in an optical device according to the invention. It is realized that such a split SOA constitutes or forms part of an optical amplification device, providing variable attenuation or amplification of the modulated output light from the optical device.

Figure 1:
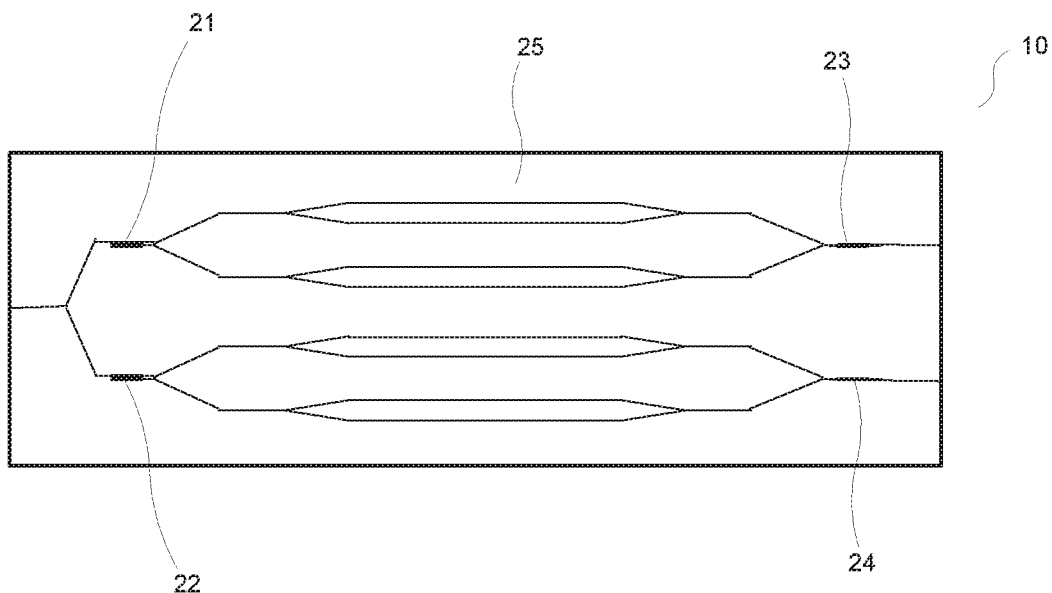
FIG. 1 is a top view of a known dual IQ modulator chip.
Figure 2A:
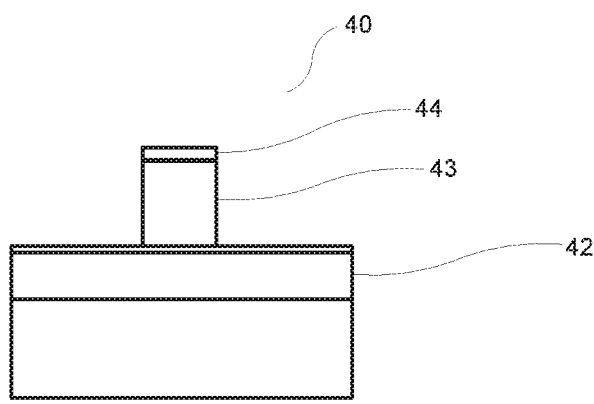
FIGS. 2a-2d are respective detail views of the chip shown in FIG. 1, and in particular showing an SOA component from a respective first cross-sectional, second cross-sectional, top and third cross-sectional views.
Figure 2B:
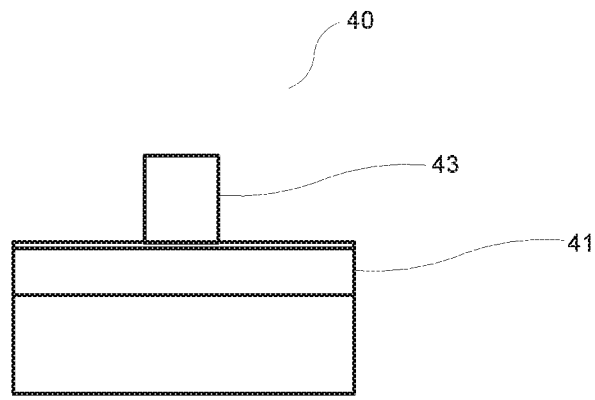
Figure 2C:
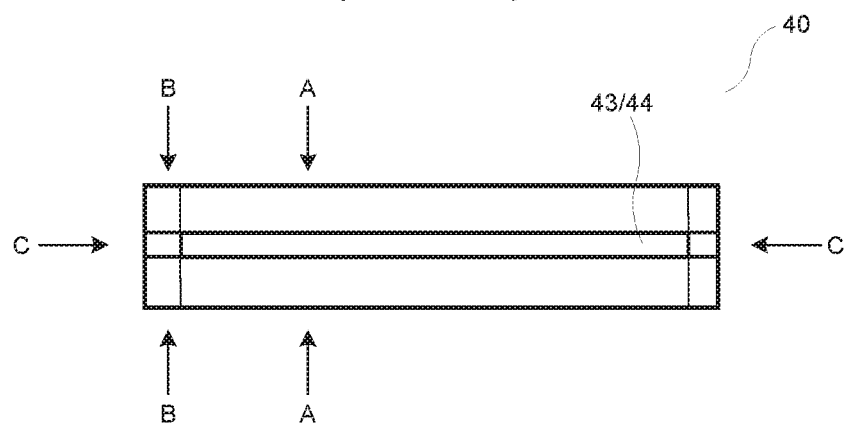
Figure 2D:
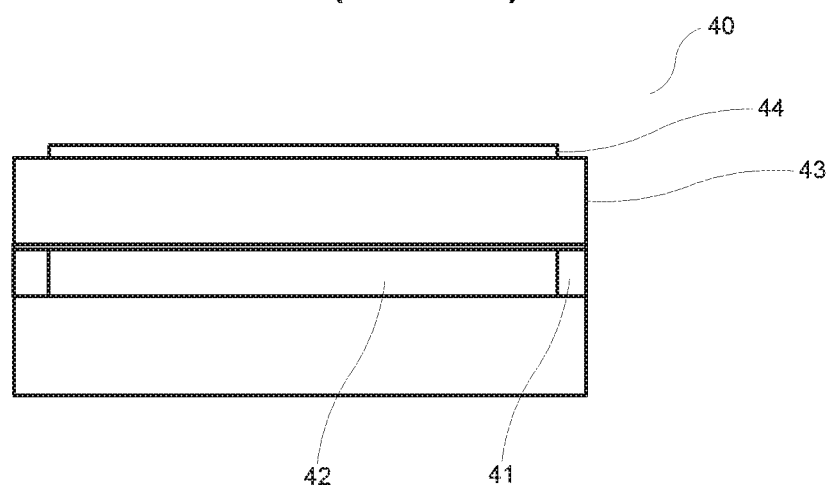
Figure 6:
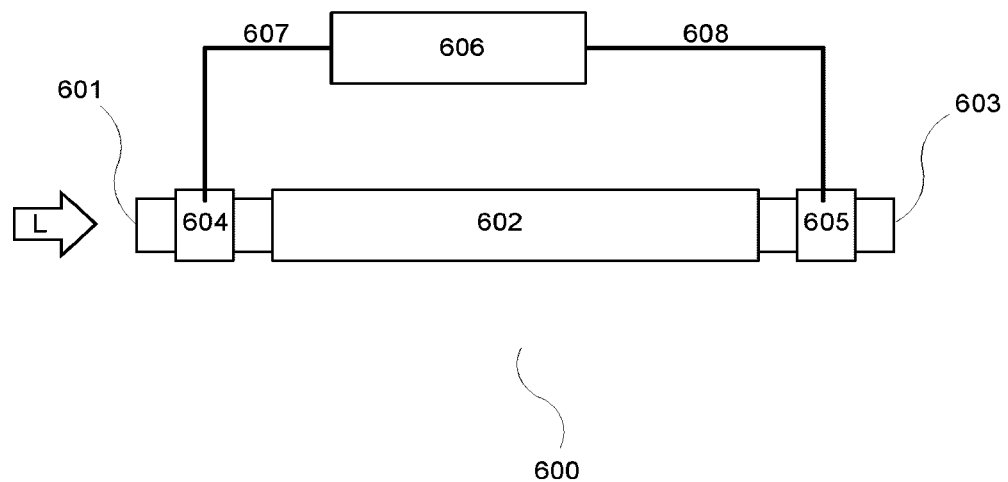
FIG. 6 is an overview diagram of an optical device according to the invention.
Figure 7A:
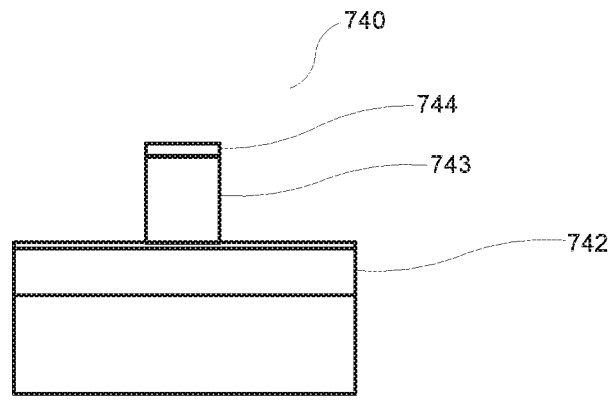
FIGS. 7a-7d are a respective first cross-sectional lateral view (through cross-section A); second cross-sectional lateral view (through cross-section B); top view; and cross-sectional longitudinal view (through cross-section C) of an optical amplification device according to a second exemplifying embodiment of the invention.
Figure 7B:
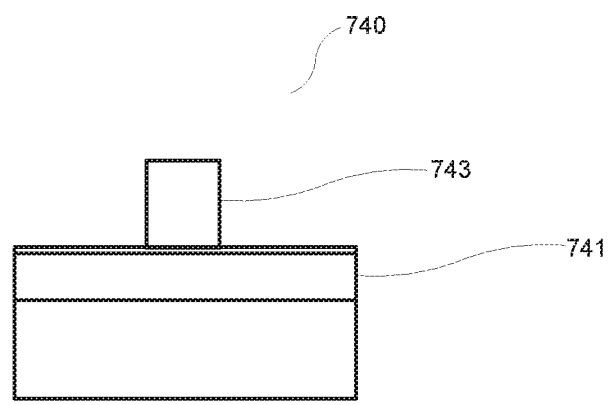
Figure 7C:
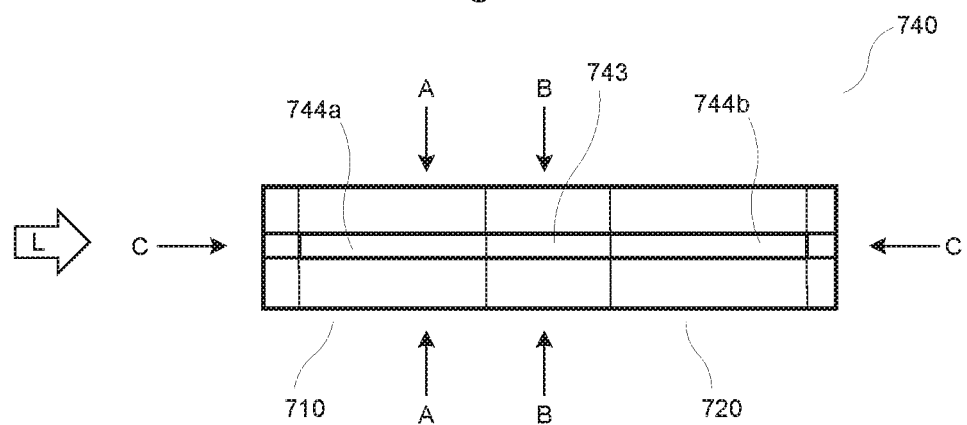
Figure 7D:
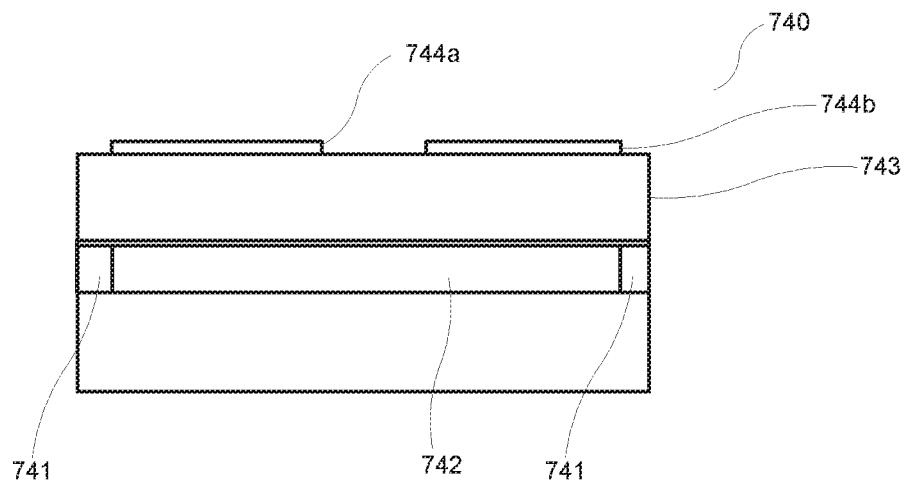
Figure 8A:
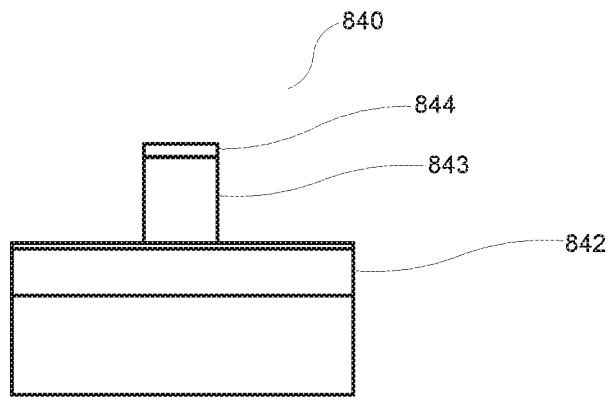
FIGS. 8a-8d are views corresponding to those of FIGS. 7a-7d, illustrating an optical amplification device according to a third exemplifying embodiment of the invention.
Figure 8B:
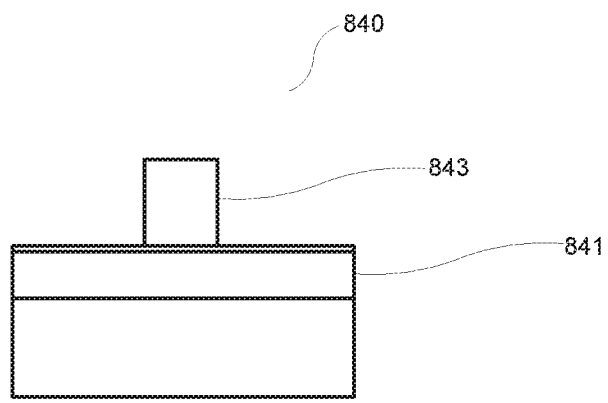
Figure 8C:
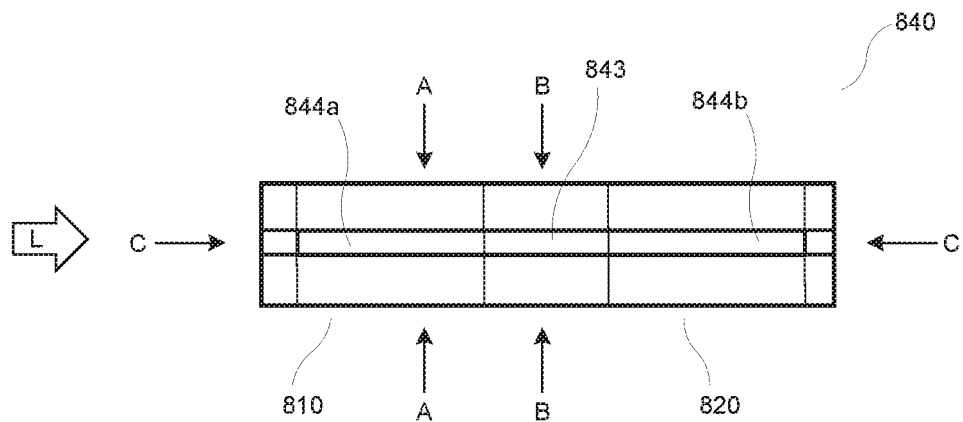
Figure 8D:
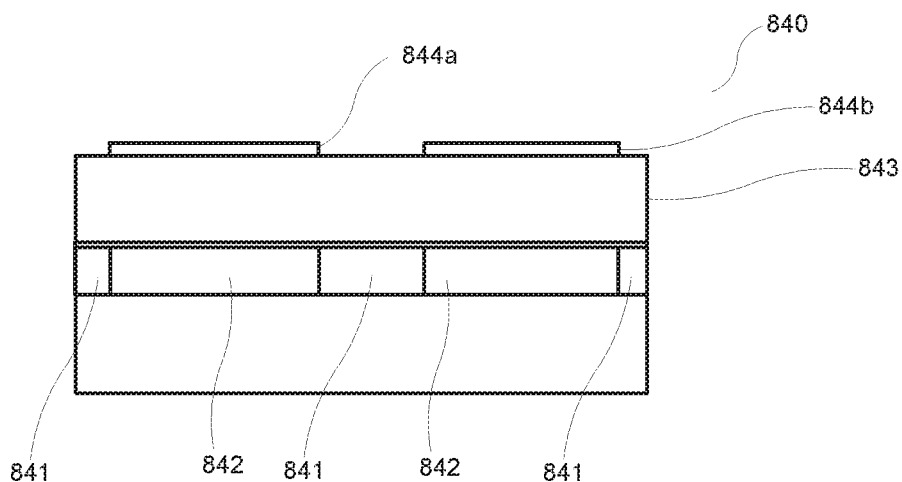
Figure 9A:
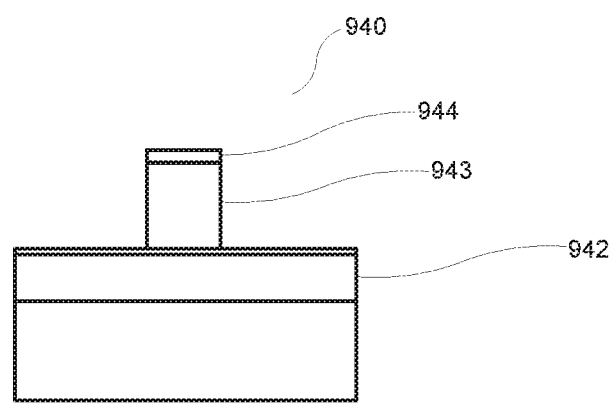
FIGS. 9a-9d are views corresponding to those of FIGS. 7a-7d, illustrating an optical amplification device according to a fourth exemplifying embodiment of the invention.
Figure 9B:
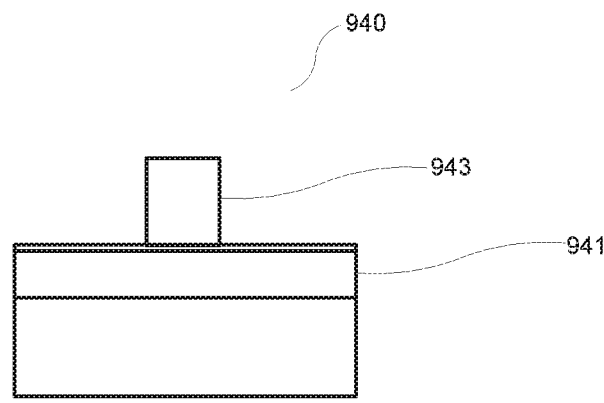
Figure 9C:
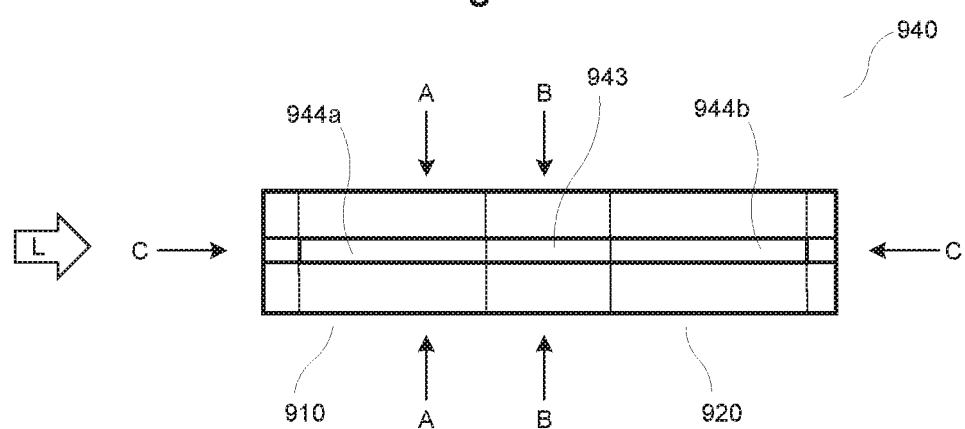
Figure 9D:
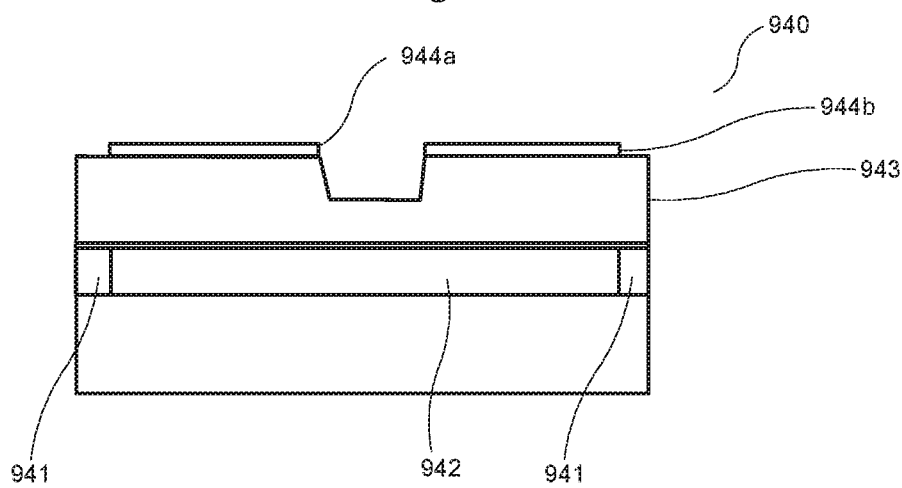
Figure 10A:
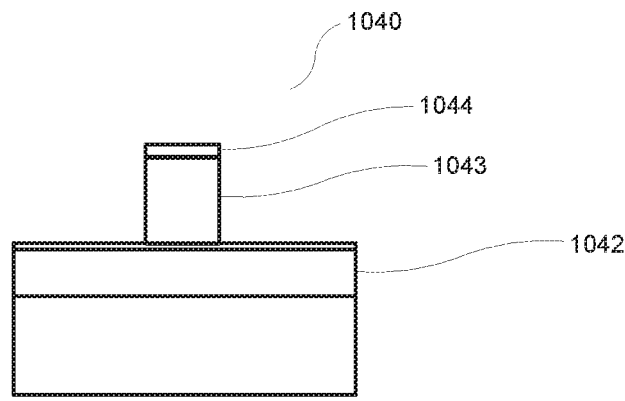
FIGS. 10a-10d are views corresponding to those of FIGS. 7a-7d, illustrating an optical amplification device according to a fifth exemplifying embodiment of the invention.
Figure 10B:
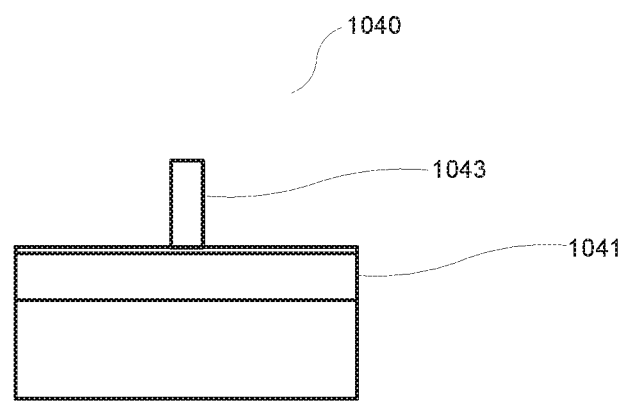
Figure 10C:
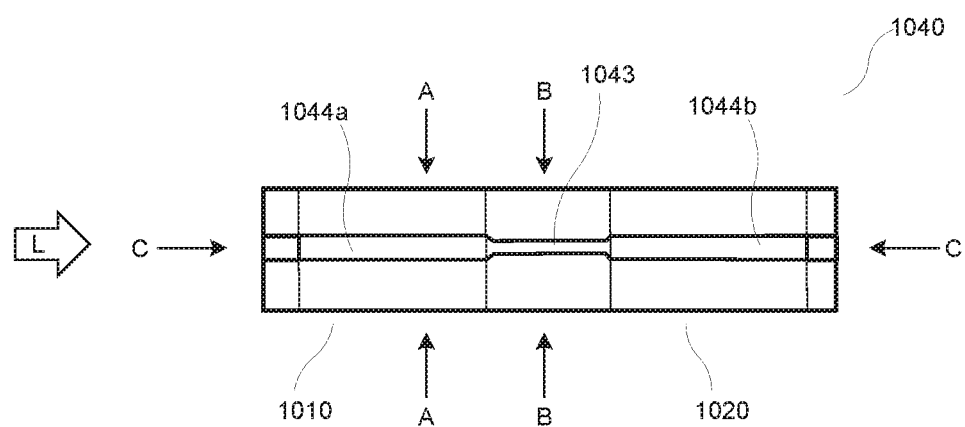
Figure 10D:
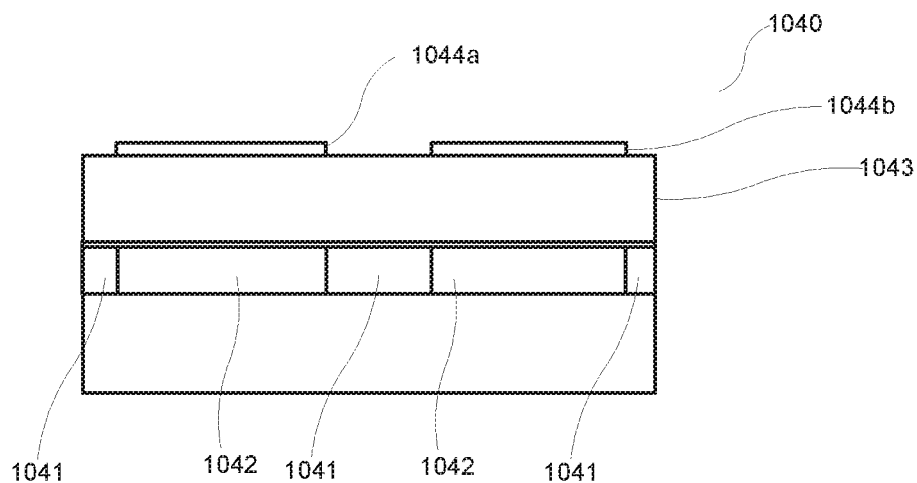

Such an optical device 600 is illustrated in FIG. 6, comprising a light input 601, a light modulation means 602 and a light output 603. The light input 601 may be arranged to receive light from a semiconductor laser, such as a laser arranged as an integrated component on the same optical chip as the optical device 600, such as forming part of the optical device 600 as such. In this case, the light input 601 may be a waveguide into which the laser inputs emitted light. The light modulation means 602 may be any suitable light modulation means, such as of the type 25 shown in FIG. 1. Preferably, the light modulation means 602 is a Mach Zehnder or an IQ (In-phase-and Quadrature) modulator, and is preferably arranged to modulate a series of discreet symbols for data transmission using the light as a carrier wave. The light output 603 may be any suitable output, such as an end facet or a waveguide, arranged to deliver the modulated and amplified light into a subsequent step, such as a combiner, for instance a MUX followed by an optical fiber. The light emitted by the laser may have any of the wavelength intervals used for fibre optical communication, but in particular the C-band 1525-1568 nm.

Specifically, the optical device 600 comprises an optical amplification device, in turn preferably comprising a pre SOA 604 and preferably also at least two serially connected post SOAs 605. The pre SOA 604 is connected, via a conductor 607 and a suitable electric contact, to a control device 606. The control device 606 is generally arranged to perform the control method steps disclosed herein, and in particular to provide a particular control SOA current through the pre SOA 604 (corresponding to a particular control SOA voltage). The control device 606 is also arranged to provide, via conductors 608 and suitable electric contacts, a particular control SOA current/voltage to the post SOAs.

Preferably, the optical device 600 is an integrated optical device. This means that at least the components 602 and 605, and preferably also 604, are integrated on the same optical chip, preferably monolithically integrated so that said components form parts of the same connected material body (which material body may change its matter composition along its extension). In particular, the at least two post SOAs 605 are preferably monolithically integrated themselves and preferably also with the modulating means 602. Preferred material systems comprise an InP substrate with waveguides of InGaAsP or AlInGaAs.

Hence, the optical amplification device, and in particular the post SOAs 605, is arranged to amplify light travelling between the light modulating means 602 and the output 603. Correspondingly, the pre SOA 604 is arranged to amplify light travelling between the light input 601 and the light modulating means 602, so as to, in combination with the post SOAs 605, achieve a desired total output light power. Hence, the total output light power at the light output 603 is basically determined by the input light power at the input 601; the amplification in the pre SOA 604; losses in the modulating means 602; and the amplification in the post SOAs 605. Preferably, the control device 606 is arranged to control the amplification in the post SOAs so as to achieve a desired output light power at the light output 603 given the input light power; a used amplification in the pre SOA 604; and known properties of the device 601 at its current modulation state.

According to the invention, the device 600 in general comprises a first and a second serially connected post SOA (Semiconductor Optical Amplifier) unit, each comprising at least one respective serially connected post SOA segment. Hence, the above-discussed post SOA segments are distributed across at least two such post SOA units. Preferably, each such post SOA unit only comprises only one single post SOA segment, but may also comprise two of more post SOA segments each. In other words, as used herein, a "SOA unit" is a single SOA segment or an aggregate of several SOA segments that are not comprised in another SOA unit. A "SOA segment" is a single SOA entity.

Furthermore according to the invention, a total SOA length of the first of said post SOA units is relatively longer than a total SOA length of the second of said post SOA units, which is relatively shorter. A "total SOA length" means the total length of the post SOA segments forming part of the post SOA unit in question, in the light direction L. Moreover, that said first post SOA unit total SOA length is "relatively longer" and that the second post SOA unit total SOA length is "relatively shorter" means that the total SOA length of the first post SOA unit is longer than the second post SOA unit, in relative terms as compared to one another. Preferably, the second post SOA unit is at least 25% shorter, more preferably at least 50% shorter than the first post SOA.

Further according to the invention, the optical device 600 is arranged to, during operation using a particular operation program, always keep respective post SOA bias voltages across each of the post SOA segments of the first post SOA unit at +0.5 V or more, preferably at +1.0 V or more. Hence, the relatively longer post SOA unit SOA segment or segments are all forward-biased.

Figure 19:
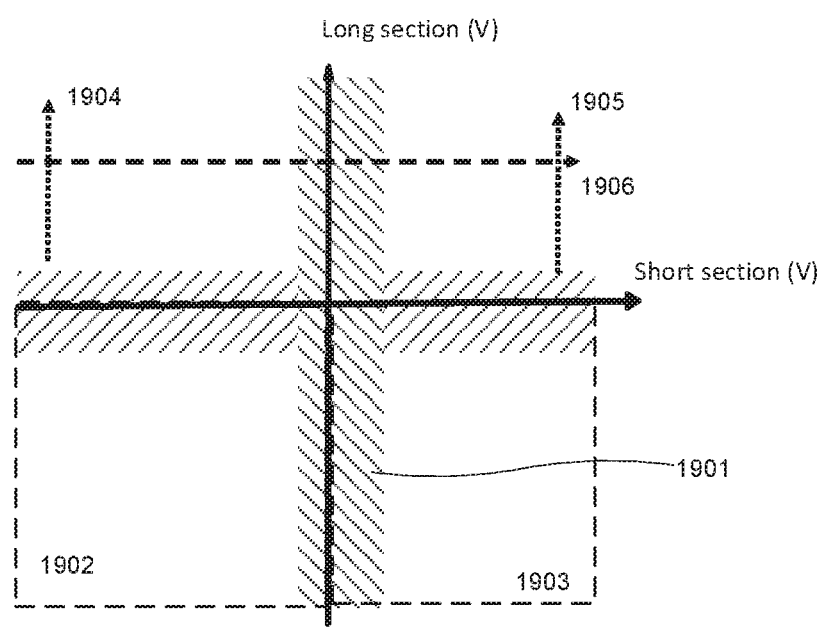
FIG. 19 is an overview map over preferred operation points in a method according to the present invention.

This is illustrated in FIG. 19, illustrating conceptually the bias (using corresponding SOA segment bias voltages) applied across the post SOA segments of the said relatively longer post SOA unit (Y axis) and the post SOA segments of the said relatively shorter post SOA unit (X axis). The dashed lines areas 1901 are reached by using intermediate bias voltages across at least one of said post SOA unit segments, which is not preferred. However, as will be clear from the following, it may be acceptable to exploit the north part of the dashed area, wherein the relatively shorter post SOA unit is operated at intermediate bias voltages.

In the lower-left quadrant, both the first and second units are reverse-biased, why amplifying losses will be large. In the lower-right quadrant, OSNR is at least deteriorated in the preferred case in which the relatively longer post SOA unit is arranged upstream, compared to the light direction L, of the relatively shorter post SOA unit, since then an absorbed signal is amplified.

Hence, according to the invention, operation points are always selected in a particular operation program, in the top-left and/or top-right quadrants, as will be exemplified in the following. This may be the case in all modulation operation programs, but not in a calibration program; during a switch from one type of modulation to a different type of modulation; and so forth.

Figure 13:
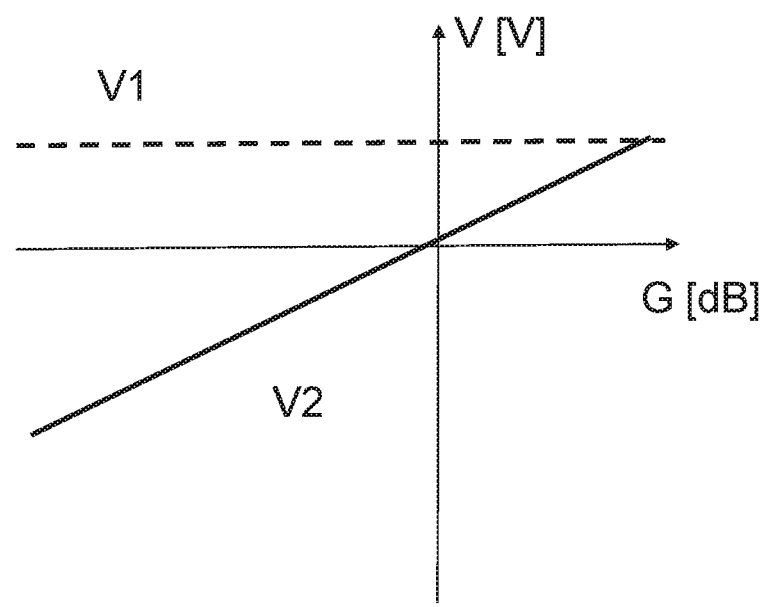
FIG. 13 is a simplified diagram illustrating a regulating scheme according to a first exemplifying embodiment of the invention.
Figure 14:
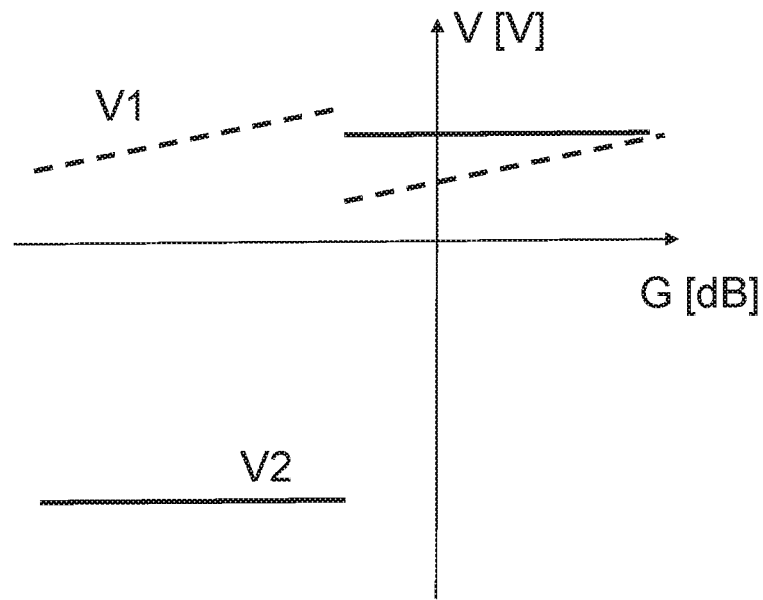
FIG. 14 is a simplified diagram illustrating a regulating scheme according to a second exemplifying embodiment of the invention.

Arrows 1904 and 1905 illustrate the operation points according to the program illustrated in FIG. 14; while arrow 1906 illustrates the operation points according to the program illustrated in FIG. 13. See below.

In general in the embodiments described herein, it is preferred that all post SOA unit segments are either forward or reverse biased, hence that no post SOA unit segment is biased at between −0.4 and +0.4 V. For reverse biased post SOA unit segments, the reverse bias is preferably at least −0.5V, preferably at least −1.0V, more preferably at least −1.5V. For forward biased post SOA segment units, the forward bias is preferably at least 0.5V preferably at least 0.7V. Depending on material systems used, these limits may be relevant in any combination.

In addition thereto, it is preferred that the most upstream arranged post SOA unit is forward biased, having V>0.

The arrows 1904, 1905, and 1906 are simplified in the sense that they may in practical embodiments be curved rather than straight. For instance for the highest frequencies, one can see in FIG. 4a that higher attenuation may be obtained at for example −1 V than at −3V. If the overlap of the power output ranges is too small, or if the minimum output power is too high, it may in that case be necessary to go to a voltage higher (less negative) than −3V in order to obtain the lowest power levels of each power tuning range. This would come at a cost of lower worst point OSNR, but depending on the particular application this may as such be acceptable at low output power.

Furthermore, the optimum combination of biases for the post SOA units may depend on the how gain and attenuation, G(l,f), depend on frequency and current for a particular gain material.

According to a preferred embodiment, which is illustrated in FIGS. 13-15 and 19, respective SOA bias voltages across the post SOAs in either the first or the second post SOA units are kept constant, while at least one of respective SOA bias voltages across the post SOAs of the other one of said first and second post SOA units are varied. Hence, the arrows 1904-1906 are straight lines. However, it is realized that curved such lines are also possible, involving simultaneous changes of respective SOA bias voltages in both first and second post SOA unit segments for varying a light amplification.

In the following, all examples involve post SOA units comprising only one post SOA segment each. It is, however, noted that, in all examples, each such described post SOA unit may comprise one or several post SOA segments. The terms "post SOA segment" and "post SOA" will be used interchangingly.

It is in general preferred that the optical device according to the invention comprises a ridge waveguide, of the type illustrated in FIGS. 2a-2d, comprising a waveguiding layer 41 and a ridge 43, and that the said post SOAs comprised in said post SOA units are arranged along such a ridge waveguide, amplifying light travelling along said ridge waveguide. Furthermore, each of said post SOA segments is preferably connected to a respective electric contact for supply of said respective SOA current to the post SOA in question, which SOA current is formed based upon an applied SOA voltage via said electric contact, and is active in achieving a particular desired amplification in the gain material of the SOA in question.

FIGS. 7a-7d, that correspond to FIGS. 2a-2d and that share the same last two digits in reference numerals for corresponding parts, illustrate a first preferred principal arrangement of the post SOAs along the ridge waveguide 740 with a gain material 742. 710 and 720 denote first and second post SOA units, respectively, along the ridge 743, each of which corresponding post SOA segments has a respective electric contact 744a, 744b.

Specifically, in the example shown in FIGS. 7a-7d, the ridge 743 is preferably uniform along its length past the post SOAs, and has an average doping of the ridge, weighted with layer thickness, which is preferably lower than $2E18/cm^3$. Furthermore, the post SOAs are electrically isolated from each other simply by the respective electric contacts 744a, 744b being separated by a distance from each other in the travel direction L of light. Preferably, the separation distance is between 2 and 30 μm.

Since the post SOA segments, as used in the present invention, have different voltages applied to them, they are in general preferably separated by an isolation, in order to avoid high leakage currents. Typical currents applied to reach the required gain are in the range up to 50 mA. It is in general preferred that an isolation between each two neighbouring post SOA segments is arranged which accomplishes that at the most 15%, preferably at the most 10%, of the respective SOA current leaks between neighbouring post SOA segments. For instance, in the case of SOA currents being at the most 50 mA, such an isolation would be at least 4 V/5 mA=800Ω.

It is also desirable to avoid excessive lengths of unpumped material between post SOA segments, since such unpumped material causes losses which defeats the purpose of the amplification of the most upstream arranged post SOA segment. A longer distance than 30 μm will typically cause high losses, although this depends on the specific application and power level (high power can effectively bleach the unpumped area).

Hence, the alternative illustrated in FIGS. 7a-7d provides a simple interruption of the metal contact 744a, 744b, while still allowing a certain leak current through the ridge 743 material. This may provide sufficient isolation, in particular in case the doping in the ridge is sufficiently low.

An option is to use lower doping in the ridge 743 locally beneath the separation of the contacts 744a, 744b, providing high isolation while still ensuring good injection under the contacts 744a, 744b. Preferably, such locally lower doping is preferably at least 90% lower than a corresponding doping beneath each contact 744a, 744b. Hence, the ridge 743 may in this case be non-uniform along its length past the post SOAs, so that a doping of the ridge 743 material provides a relatively lower electric conductivity in a region between respective electric contacts 744a, 7434 of the post SOAs and a relatively higher electric conductivity in regions occupied by said electric contacts 744a, 744b.

FIGS. 8a-8d illustrate, in a way corresponding to FIGS. 7a-7d (including the sharing of the last two digits of each reference numeral with corresponding parts in FIGS. 2a-2d and 7a-7d), another alternative regarding the isolation between the post SOA units 810, 820 in the ridge waveguide 840. Here, the ridge 843 is non-uniform along its length past the corresponding post SOAs, so that the waveguide material is a passive non-gain, modulator or non-modulator material in a region between respective electric contacts 844a, 844b of the post SOAs and a gain material in regions occupied by said electric contacts 844a, 844b. As a result, there will be no unpumped gain material in the region between the post SOA segments. Furthermore, in the case illustrated in FIGS. 8a-8d, the post SOA segments can be separated to an arbitrary distance, such as at least 30 µm, which improve isolation between them.

Correspondingly, in the waveguide 940 illustrated in FIGS. 9a-9d, the ridge 940 is non-uniform along its length past the at least two post SOA units 910, 920, so that the ridge 943 is partially etched away in a region between the respective electric contacts 944a, 944b of the corresponding post SOAs. Typically, the semiconductor layers right under the respective metal contact 943a, 943b have higher doping, why the etch of that material can increase isolation substantially. If the etch is only partial, the optical mode is disturbed only to a limited extent.

In FIGS. 10a-10d, a waveguide 1040 is shown, in the corresponding manner as FIGS. 7a-9d, in which the ridge 1043 is non-uniform along its length past the at least two post SOA units 1010, 1020, so that the ridge 1043 is laterally tapered in a region between respective electric contacts 1044a, 1044b of corresponding post SOAs, and so that the ridge 1043 is laterally narrower in such a region than in regions occupied by said electric contacts 1044a, 1044b. This may be combined with a partial removal or etching of semiconductor material in the manner illustrated in FIGS. 9a-9d.

In FIGS. 11a-11d, a waveguide 1140 is shown, in the corresponding manner as FIGS. 7a-10d, in which the ridge 1143 is non-uniform along its length past the at least two post SOA units 1110, 1120, so that the ridge 1143 is completely etched away in a region between the respective electric contacts 1144a, 1144b of corresponding post SOAs. Preferably, the length of the completely etched away region, along which there is no ridge 1143, is at least 0.1 µm, preferably at least 0.3 µm, and at the most 10 µm. In particular, the complete etching away of the ridge 1143 means that the optical guiding will be lost locally, which in general may result in high loss if occurring across any longer distance. On the other hand, resistance will in general be sufficient already for a very short distance, why the lower limit may primarily be due to practical fabrication limitations.

Figure 11A:
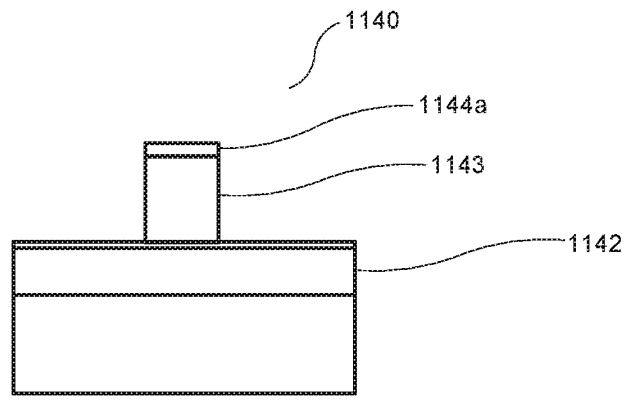
FIGS. 11a-11e are views corresponding to those of FIGS. 7a-7d, illustrating an optical amplification device according to a sixth exemplifying embodiment of the invention.
Figure 11B:
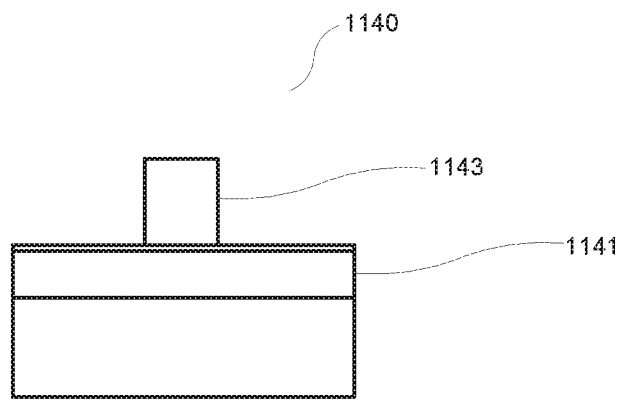
Figure 11C:
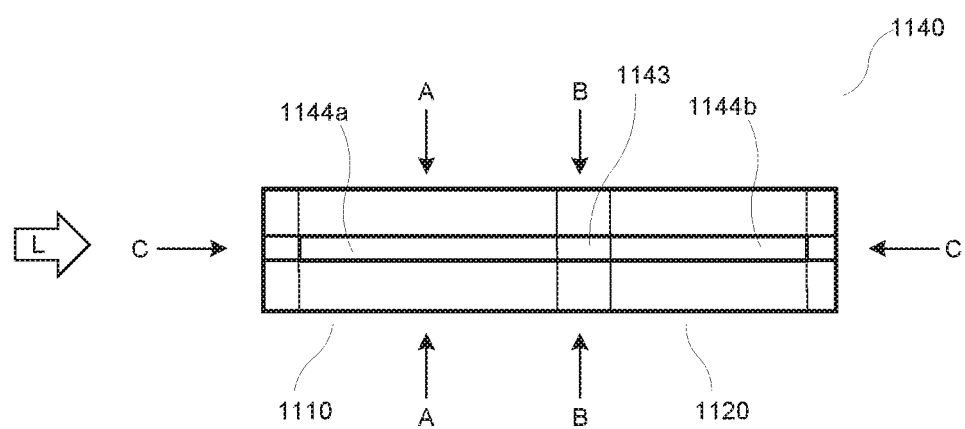
Figure 11D:
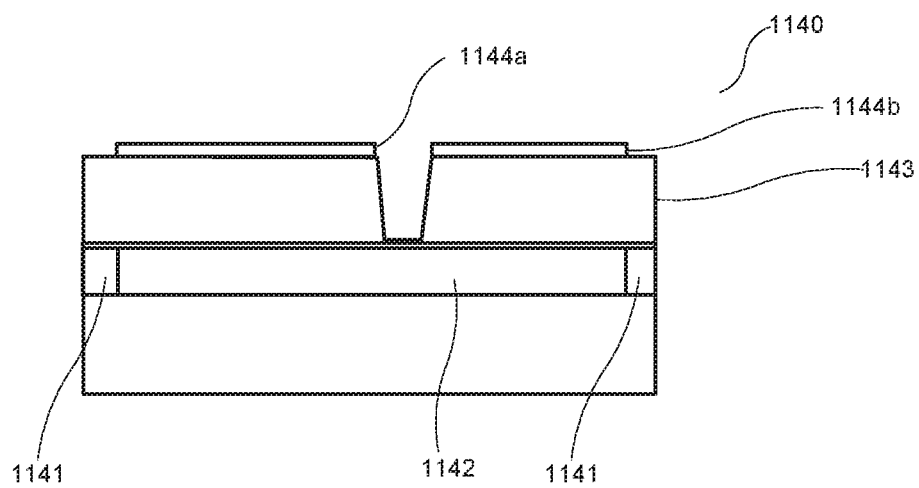
Figure 11E:
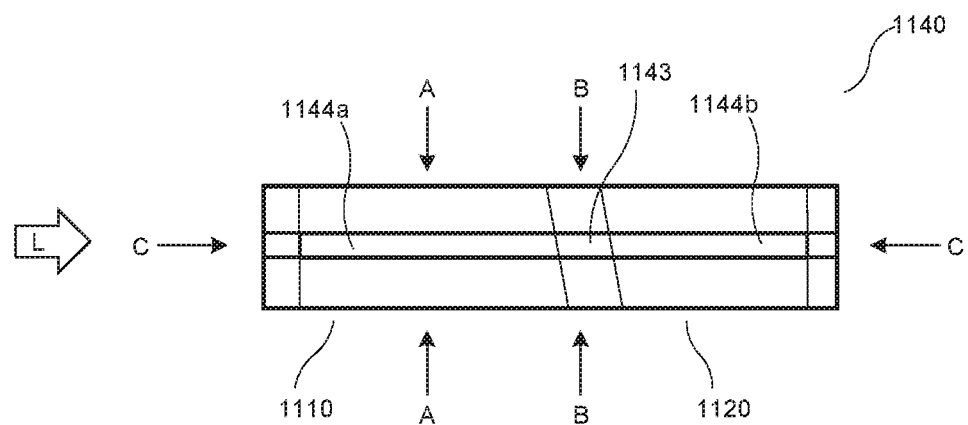

In FIG. 11e, which corresponds to FIG. 11c, the etch is inclined in relation to a longitudinal direction of the post SOA unit 1140, the said longitudinal direction coinciding with the direction L of light. The inclination is achieved by turning the etch geometry in a plane which is perpendicular to the etching direction, as compared to the non-inclined case illustrated in FIG. 11c. Such an inclination can also be arranged in other ways, as long as the faces formed by the etch are not arranged to reflect light incident from direction L back into the same waveguide or into the gain material 1142.

Figure 18:
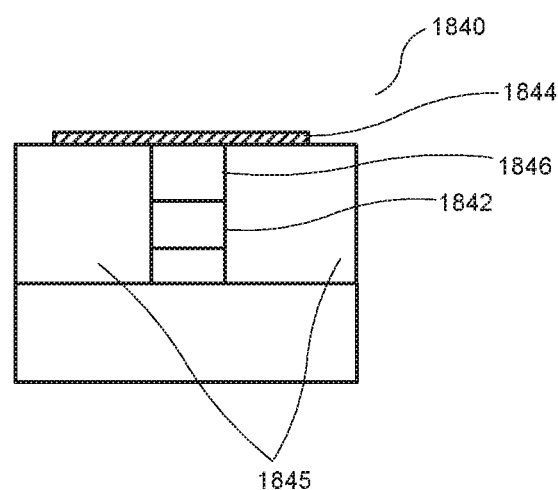
FIG. 18 illustrates an optical amplification device according to an eight embodiment of the present invention.

In an alternative embodiment, the post SOAs can be buried heterostructure SOAs, as exemplified in lateral cross-section in FIG. 18. 1840 is the post SOA unit comprising the post SOA segment in question; 1842 is gain material; 1844 is an electric contact; 1845 is current-blocking material; and 1846 is cladding material. The isolation between contacts, corresponding to the strategies described above in relation to the ridge waveguides, can then be achieved in a number of different ways, such as:

Ion Implantation in the area that needs higher resistance. This strategy is also suitable for arranging in a ridge structure.

Partial etching, stopping before the etsing reaches a waveguiding layer, such as the gain material 1842.

Local growth of lower doped material before the growth of the cladding material 1846.

In general, it is preferred that the said at least two post SOA units comprise a relatively shorter post SOA unit and at least one relatively longer post SOA unit.

In particular, it is preferred that said relatively shorter post SOA unit has a total SOA length selected so that it provides at the most 20%, preferably at the most 15%, of the total optical amplification provided by the invention's optical amplification device amplification when all post SOA segments of said at least two post SOA units are deeply forward biased.

In general, it is preferred that a relatively longer post SOA unit is arranged upstream of a relatively shorter post SOA unit. In particular, the post SOA units are preferably arranged in order of falling length, in the downstream direction. Herein, all references to "upstream" and "downstream" correspond to the light direction L during normal operation.

The present inventors foresee at least two alternative arrangements. It is understood that, when it is stated that a post SOA current or voltage is applied to or across a particular post SOA unit, what is meant is that it is applied to the post SOA segments comprised in the post SOA unit in question. Preferably, and in general, the same SOA bias voltage is applied to all post SOA segments comprised in one and the same post SOA unit.

According to a first alternative, the respective SOA current is kept constant through the relatively longer post SOA unit, while it at the same time is varied through the relatively shorter post SOA unit. In this alternative, a forward bias of the relatively longer post SOA unit may also be set to a desired, constant but changeable value, as a way to increase the available amplification interval. However, the bias voltage across the relatively shorter post SOA unit is preferably varied across a voltage interval which is considerably broader than for the bias voltage through the relatively longer post SOA unit, such as at least twice the interval width. This way, the relatively more varied bias of the relatively shorter post SOA unit will not add much to the total noise produced, and the relatively longer post SOA unit is not varied much. As a result, the OSNR and the worst point OSNR do not vary much.

According to a second alternative, the respective SOA current is varied through the relatively longer post SOA unit, while it at the same time being kept at a constant but changeable value through the relatively shorter post SOA unit.

The second alternative may advantageously be used with only two post SOA units, but is in general more preferred for configurations with more than two relatively shorter post SOA units in combination with at least one (preferably only one) relatively longer post SOA unit. Then, the device is arranged to achieve a general amplification level by either (preferably strongly) forward or (preferably deeply) reverse biasing each of said relatively shorter post SOA unit SOAs, by applying a corresponding constant SOA current through the post SOA unit in question, and to vary the SOA current through the relatively longer post SOA unit to achieve a desired amplification. In particular in this alternative, it is preferred that the relatively shorter post SOA units have a total SOA length selected so that they provide between 50% and 90% of the total variability of the optical gain adjustment range provided by the invention's optical amplification device.

Herein, that a post SOA unit is controlled using a "constant" bias current means that, for a particular mode of operation, the bias current applied to the corresponding post SOA segments it is constant. For instance, such a constant bias current may reflect operation within a particular desired amplification interval as described herein. It is also possible that such a constant bias current is selected during a calibration step, or similar, and thereafter kept constant. In contrast thereto, a "variable" bias current may be varied within a particular mode of operation, such as in realtime. In particular, a "constant but changeable value" may be changed intermittently between a strongly forward biased value and a deeply reverse biased value so as to achieve a desired gain region which may be fine-tuned by varying a respective variable post SOA bias current.

Figure 12:
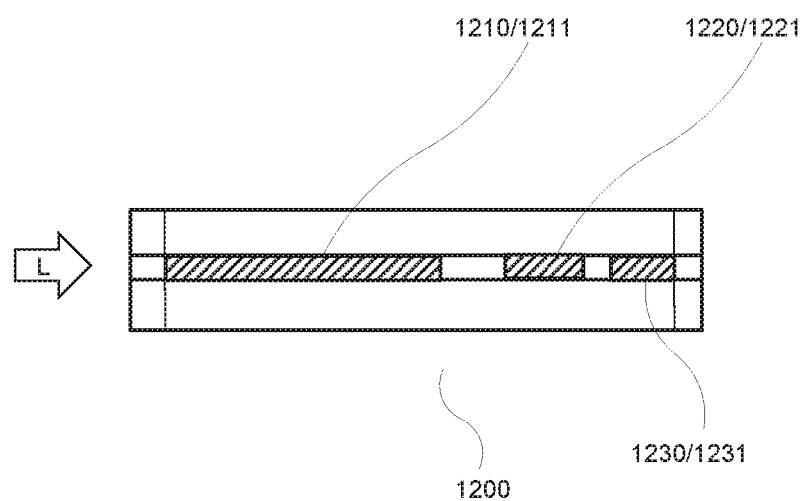
FIG. 12 is a simplified top view of an optical amplification device according to a seventh exemplifying embodiment of the present invention, comprising three post SOA segments.

As mentioned above, FIG. 5 illustrates a preferred example using only two post SOA segments 510, 520. Post SOA segment 510 is relatively longer, while post SOA segment 520 is relatively shorter. It is realized that post SOA segments 510, 520 constitute respective one-SOA-segment post SOA units in the terminology of the present invention. FIG. 12 illustrates a preferred example using three post SOA units—one relatively longer post SOA unit 1210 and two relatively shorter post SOA units 1220, 1230, all serially arranged with respect to each other and associated with a respective electrode 1211, 1221, 1231 for individual control of a respective SOA current.

As is clear from both FIG. 5 and FIG. 12, it is preferred that the relatively longer post SOA unit is arranged upstream of any relatively shorter post SOA units.

FIGS. 13 and 14 illustrate, in respective simplified and principally shown graphs, respective possible biasing regulation schemes using the configuration shown in FIG. 5, with two post SOAs 510, 520. In FIG. 13, the second contact 521 (connected to the relatively shorter post SOA 520) voltage (V2) is responsible for the whole adjustment of the gain of the optical amplification device during continuous operation, while the voltage (V1) of the first contact 511 (connected to the relatively longer post SOA 510) is always during continuous operation kept constant and forward biased. It is noted that FIGS. 13 and 14 are only schematic, and that the straight lines shown may in reality be curved. In particular, at lower operation frequencies (such as below 3 THz beneath the maximum frequency employed) the attenuation provided via the second contact 521 may not be sufficient, so the bias of the first contact 511 may need to be reduced.

In contrast to FIG. 13, in FIG. 14 the intermediate ranges of voltage settings giving rise to a large attenuation slope are avoided. The second contact 521 voltage (V2) is in either of two regions, and the fine adjustment is done using variations of the voltage (V1) provided via the first contact 511. Again, in practice the straight lines may be curved.

Figure 15:
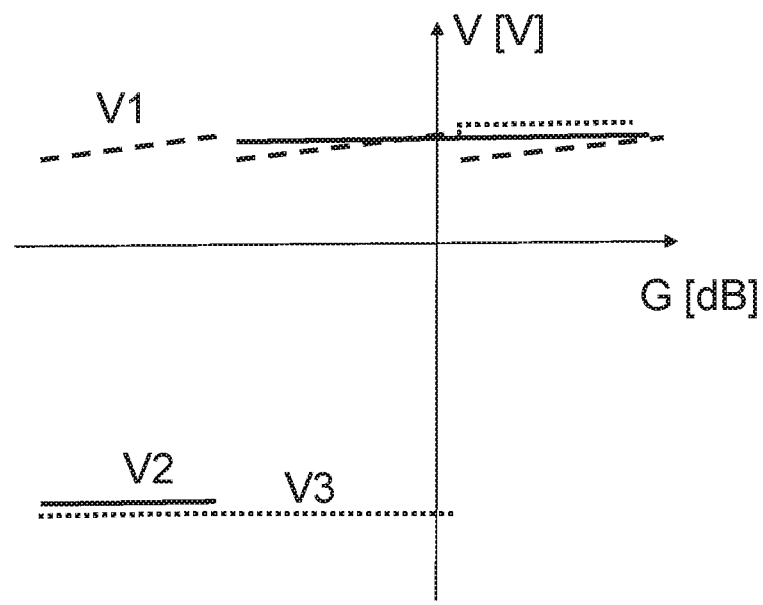
FIG. 15 is a simplified diagram illustrating a regulating scheme according to a third exemplifying embodiment of the invention.

FIG. 15 is similar to FIGS. 13 and 14, schematically showing a possible biasing regulation scheme for the configuration shown in FIG. 12, with three post SOA units 1210, 1220, 1230. Intermediate voltage ranges are again avoided, that would otherwise result in a large attenuation slope. The several relatively shorter contacts 1221, 1231 are each either (preferably strongly) forward or (preferably deeply) reverse biased. The total length of deeply biased material determines the rough attenuation level, and the fine adjustment is done in the first contact 1211. As is the case for FIGS. 13 and 14, FIG. 15 is only schematic and the straight lines may in practice be curved.

As is noted in relation to FIGS. 14 and 15, amplification across the complete interval is achieved without ever applying an intermediate bias voltage to any of the post SOA segments comprised in any of the post SOA units. Instead, one or several of the post SOA units (preferably, relatively shorter post SOA units) are set to one of two possible constant values—strong forward bias or deep reverse bias, so as to achieve a coarse amplification level. Then, the exact bias voltage applied to another post SOA unit (preferably, a or the relatively longer post SOA unit) is fine-tuned within a region of forward bias so as to achieve the exact desired amplification.

Regarding the total SOA length of each individual post SOA unit, a useful range of power adjustment is of the order of $DG_{target}$=10 dB between a lowest and a highest used amplification.

For the simplest biasing scheme shown in FIG. 13, the length of the second post SOA segment 520 is selected so that at the higher operation frequencies of the used frequency interval, the said range of G can be achieved. Looking at FIGS. 4a and 4b, for this 50 μm long device G can be varied by $DG_{shallow}$ (that is, G(1.5 V)–G(0.0 V), between which voltage values the function G is monotonously growing)=13 dB between V≈0 V up to V≈1.5 V. Therefore, the desired power adjustment range of 10 dB can be performed with some margin, and 50 μm is an appropriate length for the second post SOA segment 520.

For the biasing scheme illustrated in FIG. 14, the second segment 520 is only responsible for roughly half of the variation of the output light power. For the higher frequencies, the second segment 520 is switched between strong forward bias and deep reverse bias (for example –3V). In this case (see FIG. 3), the attenuation varies by $DG_{deep}$ (that is, G(1.5 V)–G(–3 V))≈10 dB for the higher frequencies. To obtain a gain adjustment of for example 60% of the required adjustment range, $DG_{target}$*60%=6 dB, the second segment 520 should have a length of roughly 50 μm*(60%*$DG_{target}$/$DG_{deep}$)=30 μm.

When the number of units N is higher than 2, in particular in combination with the biasing scheme shown in FIG. 15, the first unit 1210 will be in forward bias, and the remaining (N–1) units will be responsible for varying gain by for example $$\frac{N-1}{N},$$

in the case where these units 1210, 1220, 1230 all have similar length. Therefore, the total SOA length of the (N–1) later unit should be approximately $$50 \cdot \frac{N-1}{N} \frac{DG_{target}}{DG_{deep}} \mu m.$$

There may also be more than three post SOA units, in particular in case relatively short post SOA units have varying total SOA lengths, such as total SOA lengths that are decreasing the further downstream of the light input the post SOA unit in question is arranged. For instance, according to one preferred embodiment, the respective total SOA lengths of the at least two, preferably all, relatively shorter post SOA units are selected so that a relative total SOA length of each of said relatively shorter SOA units n is $L_n=2^n-1$, for $n \geq 1$. In that way, one can apply a combination of strong forward or deep reverse bias on those in a binary way that makes it possible to reach many different levels (for example $2^n$ without recurring to fine adjustment. It is noted that this approach for selecting relative lengths works already with three post SOA units.

In general, when there are more than one relatively shorter post SOA unit, it is preferred that the relatively shorter post SOA units are individually controlled to a constant strong or maximum predetermined forward bias or a deep predetermined reverse bias, so as to achieve a constant amplification which is at a desired level, and which is fine-tuned by controlling the variable bias of the relatively longer post SOA unit. Hence, a number of relatively shorter post SOA units may be reverse biased while the rest is or are strongly forward biased, so as to achieve a desired one of a number of predetermined constant amplifications.

In one preferred embodiment, there are at least one (preferably exactly one) relatively longer post SOA unit in combination with at least three relatively shorter post SOA units.

The individual total SOA lengths of the post SOA units, discussed above, can be determined by considering sufficient attenuation at the high frequency side only, in other words by performing the analysis given a highest frequency to be used for light modulation using the said modulating means. At the low frequency side, the worst point OSNR does not suffer much when the current and amplification in the first unit is reduced. This is so since both the gain peak and the ASE peak move to lower frequencies with lower bias.

The total combined SOA length of the post SOA units is preferably determined so that high enough total amplification is obtained for forward injection for the frequency range under consideration. Preferably, the total combined SOA length of the relatively shorter post SOA units is determined. Then, the total SOA length of the or each relatively longer post SOA unit is determined so as to achieve a total post SOA unit length which achieves the desired total maximum amplification.

Figure 16:
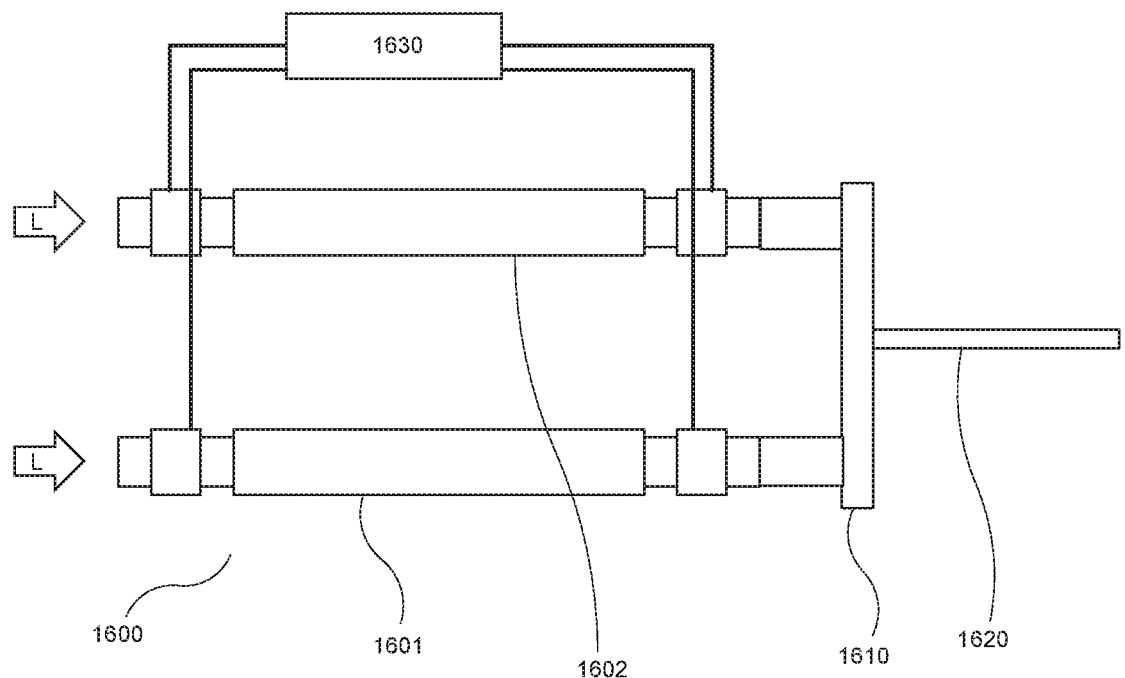
FIG. 16 is an overview diagram of an aggregated optical device according to the invention.

The present invention is suitable for application in cases when output light from several modulating units are combined into one and the same optical fibre. In particular, the present invention further relates to a combined optical device 1600, as illustrated in FIG. 16, comprising at least two integrated optical devices 1601, 1602 of the type discussed above. The combined optical device further comprises a light combining device 1610, preferably a MUX (MUltipleXing) device, arranged to combine light exiting through the respective outputs of the integrated optical devices 1601, 1602 into one single optical fibre 1620. Preferably, the MUX 1610 is a polarization MUX. A control unit 1630, which may the same as control unit 606 of FIG. 6) controls the post SOA segments via their respective bias currents, and preferably also the respective pre SOAs.

This way, the relative amplification of each MUXed light signal can be adjusted very rapidly and with high precision, with low losses and in a compact design.

Since the worst point OSNR tends to fall at the lower end of power ranges (for example the beginning end of arrows 1904, 1905, 1905 in FIG. 19) to maintain the specified worst point OSNR, it may be necessary to increase the power into the most upstream post SOA unit by increasing the pre SOA current for the lowest part of the used power ranges. This higher pre SOA current may not be necessary for the intermediate part of the used power ranges, since there the worst-point OSNR will automatically be higher.

An alternative to increasing the pre SOA current is to increase the power from the laser into the pre SOAs.

Figure 17:
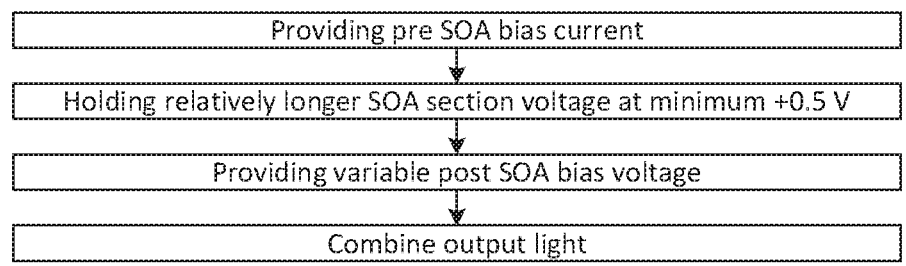
FIG. 17 is a flowchart illustrating a method according to the present invention.

FIG. 17 illustrates a method according to the present invention, for modulating light using an optical device of the above described type. The modulation is performed using said modulating means.

In a first step, a pre SOA bias current is selected and applied to the pre SOA as described above. The pre SOA bias current may be selected as the same predetermined value every time the method is performed, and is preferably constant during continuous operation. When a very high output power is required, the pre SOA current may temporarily be set to a higher current. When the highest levels of output current are no longer required, a lower pre SOA current may be used as long as sufficiently high power reaches the most upstream post SOA to maintain high enough OSNR or worst point OSNR.

In a next step, a post SOA bias voltage is provided, as discussed above, through a relatively longer one of the post SOA units, which is at minimum +0.5 V.

In a next step, which is performed while holding said bias voltage at minimum +0.5 V, respective SOA bias voltages across the said post SOA segments comprised in said relatively longer and/or relatively shorter SOA units are varied, to achieve a desired amplification level of light passing the optical amplification device.

In a next step, light output from the output of the optical device is conveyed to a MUX (MUltipleXing) device as described above, and is combined with light exiting through the output of a second optical device, which second optical device is also of the above described type, so that the respective light output from the said optical devices is integrated into one single optical fibre. It is noted that the first and second optical devices may be arranged on the same chip.

As in introductory step, a modulation operation program may be selected, possibly from a set of available such programs, which operation program features keeping said relatively longer post SOA unit at minimum +0.5 V at all times during operation.

Above, preferred embodiments have been described. However, it is apparent to the skilled person that many modifications can be made to the disclosed embodiments without departing from the basic idea of the invention.

For instance, many other different ways of splitting up a single post SOA into a series of corresponding post SOA units and the segments are thinkable, as long as they respect the inventive principles described herein. For instance, there may be several SOA units that are varied in terms of bias so as to together achieve a certain desired amplification. Furthermore, one or several of the SOA units may be static in the sense that they are always biased using the same predetermined current.

A large number of individual optical modulating device may be arranged together, and perhaps MUXed together into the same optical fibre, as the case may be. The optical modulation device according to the invention may also be combined with many other optical components, such as conventional optical modulation devices, on the same integrated or non-integrated optical board.

In general, the optical modulating device according to the present invention may have more than one light input and/or more than one light output. In particular, this would be the case for a dual IQM.

In general, all which has been said regarding the method according to the invention is equally applicable to the device, and vice versa.

Hence, the invention is not limited to the described embodiments, but can be varied within the scope of the enclosed claims.

What is claimed is:

1. An optical device comprising:
   a light input;
   a light modulating means;
   a light output; and
   an optical amplification device arranged to amplify light travelling between the light modulating means and the light output,
   wherein:
   the optical amplification device comprises a first and a second serially connected post SOA (Semiconductor Optical Amplifier) unit;
   each of the post SOA units comprises at least one respective serially connected post SOA segment;
   the optical device is arranged to vary a light amplification by varying respective SOA bias voltages across the post SOA segments;
   a total SOA length of the first post SOA unit is relatively longer than a total SOA length of the second post SOA unit, which is relatively shorter; and
   the optical device is arranged to, during operation, always keep respective SOA bias voltages across each of the post SOA segments of the first post SOA unit forward biased at +0.5 V or more,
   wherein the optical device comprises at least two of the relatively shorter second post SOA units and one of the relatively longer first post SOA unit, and
   wherein the device is arranged to achieve a general amplification level by either forward or reverse biasing each post SOA segment comprised in the at least two relatively shorter second post SOA units by applying a corresponding constant SOA bias voltage across the SOA segment in question, and to vary the SOA bias voltage across each post SOA segment comprised in the relatively longer first post SOA unit to achieve a desired amplification.

2. The optical device according to claim 1, wherein the first post SOA unit is arranged upstream, as compared to a direction of light, of the at least two second post SOA units.

3. The optical device according to claim 1, wherein the optical device further comprises a pre SOA arranged to amplify light travelling between the light input and the light modulating means to achieve a desired total output light power.

4. The optical device according to claim 1, wherein the post SOA segments are monolithically integrated.

5. The optical device according to claim 4, wherein the light modulating means are also monolithically integrated with the post SOA segments.

6. The optical device according to claim 4, wherein the post SOA segments are arranged along a ridge or buried heterostructure waveguide, comprising a waveguiding layer, and wherein the post SOA segments of each of the respective post SOA units are connected to a respective electric contact for supply of the respective SOA bias voltage.

7. The optical device according to claim 6, wherein the post SOA segments are electrically isolated from each other simply by the respective electric contacts being separated by a distance from each other.

8. The optical device according to claim 6, wherein the ridge is non-uniform along its length past the post SOA segments, so that a doping of the ridge provides a relatively lower electric conductivity in a region between respective electric contacts of the post SOA segment and a relatively higher electric conductivity in regions occupied by the electric contacts.

9. The optical device according to claim 6, wherein the ridge waveguide is non-uniform along its length past the post SOA segments, so that the waveguide material is a passive, non-gain material in a region between respective electric contacts of the post SOA segments and a gain material in regions occupied by the electric contacts.

10. The optical device according to claim 6, wherein the ridge is non-uniform along its length past the post SOA segments, so that the ridge is partially etched away in a region between respective electric contacts of the post SOA segments.

11. The optical device according to claim 6, wherein the ridge is non-uniform along its length past the post SOA segments, so that the ridge is tapered in a region between respective electric contacts of the post SOA segments, so that the ridge is laterally narrower in such a region than in regions occupied by the electric contacts.

12. The optical device according to claim 6, wherein the ridge is non-uniform along its length past the post SOA segments, so that the ridge is completely etched away in a region between respective electric contacts of the post SOA segments, which region is at least 0.1 μm and at the most 10 μm.

13. The optical device according to claim 1, wherein the at least two relatively shorter second post SOA units have a total length selected so that they provide between 50% and 90% of the total optical gain adjustment range provided by the optical amplification device.

14. The optical device according to claim 1, wherein the respective total SOA lengths of the at least two relatively shorter second post SOA units are selected so that a relative length of each of the at least two relatively shorter post SOA units n is $L_n=2n-1$, for $n \geq 1$.

15. A combined optical device comprising at least two optical devices, each of the at least two optical devices comprising:
   a light input;
   a light modulating means;
   a light output; and
   an optical amplification device arranged to amplify light travelling between the light modulating means and the light output,
   wherein:
   the optical amplification device comprises a first and a second serially connected post SOA (Semiconductor Optical Amplifier) unit;
   each of the post SOA units comprises at least one respective serially connected post SOA segment;
   the optical device is arranged to vary a light amplification by varying respective SOA bias voltages across the post SOA segments;

a total SOA length of the first post SOA unit is relatively longer than a total SOA length of the second post SOA unit, which is relatively shorter; and the optical device is arranged to, during operation, always keep respective SOA bias voltages across each of the post SOA segments of the first post SOA unit forward biased at +0.5 V or more, wherein the combined optical device comprises a MUX (MUltipleXing) device arranged to combine light exiting through the respective outputs of the optical devices into one optical fiber.

16. The combined optical device according to claim 15, wherein respective SOA bias voltages across the post SOA segments in either the first or the second post SOA units are kept constant, while at least one of respective SOA bias voltages across the post SOA segments of the other one of said the first and second post SOA units are varied.

17. The combined optical device according to claim 15, wherein the respective SOA bias voltage is kept constant across the relatively longer post SOA unit and is varied across the relatively shorter post SOA unit.

18. The combined optical device according to claim 15, wherein each of the at least two optical devices comprises at least two relatively shorter post SOA units and one relatively longer post SOA unit, and wherein the device is arranged to achieve a general amplification level by either forward or reverse biasing each post SOA segment comprised in the relatively shorter post SOA units by applying a corresponding constant SOA bias voltage across the SOA segment in question, and to vary the SOA bias voltage across each post SOA segment comprised in the relatively longer post SOA unit to achieve a desired amplification.

19. A method for modulating light using an optical device comprising
a light input;
a light modulating means;
a light output; and
an optical amplification device arranged to amplify light travelling between the light modulating means and the output, in turn comprising a first and a second serially connected post SOA (Semiconductor Optical Amplifier) unit, each comprising at least one respective serially connected post SOA segment, wherein a total SOA length of the first post SOA unit is relatively longer than a total SOA length of the second post SOA unit, which is relatively shorter,
which method comprises varying respective SOA bias voltages across the post SOA segments to achieve a desired amplification level of light passing the optical amplification device while keeping respective SOA bias voltages across the post SOA segments of the first SOA unit forward biased at minimum +0.5 V,
wherein the optical device comprises at least two of the relatively shorter second post SOA units and one of the relatively longer first post SOA unit, and wherein the method comprises providing a respective constant SOA bias voltage across each of the post SOA segments comprised in the at least two relatively shorter second post SOA units so as to achieve a general amplification level, which respective constant SOA bias voltages each is either a forward or reverse biasing voltage with respect to each of the at least two relatively shorter second post SOA units, and
wherein the method further comprises providing the variable SOA bias voltage across the post SOA segments comprised in the relatively longer first post SOA unit to achieve a desired amplification.

20. The method according to claim 19, wherein the optical device further comprises a pre SOA arranged to amplify light travelling between the light input and the light modulating means, and wherein the method further comprises selecting a SOA bias voltage across the pre SOA to achieve a desired total output light power.

21. The method according to claim 19, wherein the at least two relatively shorter second post SOA units have a total SOA length selected so that they provide between 50% and 90% of the total optical gain adjustment range provided by the optical amplification device when all of the post SOA segments are fully forward biased.

22. The method according to claim 19, wherein the respective total SOA lengths of the at least two relatively shorter second post SOA units are selected so that a relative total SOA length of each of the relatively shorter post SOA units n is $L_n=2n-1$, for $n \geq 1$.

23. A method for modulating light using an optical device comprising
a light input;
a light modulating means;
a light output; and
an optical amplification device arranged to amplify light travelling between the light modulating means and the output, in turn comprising a first and a second serially connected post SOA (Semiconductor Optical Amplifier) unit, each comprising at least one respective serially connected post SOA segment, wherein a total SOA length of the first post SOA unit is relatively longer than a total SOA length of the second post SOA unit, which is relatively shorter,
which method comprises varying respective SOA bias voltages across the post SOA segments to achieve a desired amplification level of light passing the optical amplification device while keeping respective SOA bias voltages across the post SOA segments of the first SOA unit forward biased at minimum +0.5 V,
wherein the method also comprises a step in which light output from the output of the optical device is conveyed to a MUX (MUltipleXing) device, and is combined with light exiting through the output of a second integrated optical device, so that the respective light output from the optical devices is integrated into one single optical fiber.

24. The method according to claim 23, further comprising providing a constant SOA bias voltage across the respective post SOA segments comprised in at least one of the first and second post SOA units, which constant SOA bias voltage is provided as a full forward or full backward bias current through the post SOA segments in question.

25. The method according to claim 24, further comprising providing the constant SOA bias voltage through the post SOA segments comprised in the relatively longer post SOA unit, and comprising providing a variable SOA bias voltage across at least one of the post SOA segments comprised in the other post SOA unit.

26. The method according to claim 24, wherein the optical device comprises at least two relatively shorter post SOA units and one relatively longer post SOA unit, and wherein the method comprises providing a respective constant SOA bias voltage across each of the post SOA segments comprised in the relatively shorter post SOA units so as to achieve a general amplification level, which respective constant SOA bias voltages each is either a forward or reverse biasing voltage with respect to each of the relatively shorter post SOA units, and wherein the method further comprises providing the variable SOA bias voltage across the post SOA segments comprised in the relatively longer post SOA unit to achieve a desired amplification.

* * * * *